(12) United States Patent
Matsuo

(10) Patent No.: US 7,902,603 B2
(45) Date of Patent: Mar. 8, 2011

(54) SEMICONDUCTOR DEVICE AND METHOD OF MANUFACTURING THE SAME

(75) Inventor: Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/591,643

(22) Filed: Nov. 25, 2009

(65) Prior Publication Data

US 2010/0072550 A1 Mar. 25, 2010

Related U.S. Application Data

(62) Division of application No. 11/898,020, filed on Sep. 7, 2007, now Pat. No. 7,642,162.

(30) Foreign Application Priority Data

Sep. 8, 2006 (JP) ................. 2006-243844

(51) Int. Cl.
*H01L 27/12* (2006.01)
(52) U.S. Cl. ................. 257/347; 257/E27.112
(58) Field of Classification Search ........... 257/E27.112, 257/E27.06
See application file for complete search history.

(56) References Cited

U.S. PATENT DOCUMENTS

| | | | |
|---|---|---|---|
| 7,358,136 B2 | 4/2008 | Jung | |
| 7,368,352 B2 | 5/2008 | Kim et al. | |
| 2004/0084734 A1 | 5/2004 | Matsuo | |
| 2004/0124492 A1 | 7/2004 | Matsuo | |
| 2007/0134819 A1* | 6/2007 | Uchiyama | 438/3 |
| 2007/0138528 A1* | 6/2007 | Haller | 257/300 |
| 2007/0210350 A1* | 9/2007 | Omura et al. | 257/287 |
| 2008/0121954 A1* | 5/2008 | Shuto | 257/295 |

FOREIGN PATENT DOCUMENTS

| | | |
|---|---|---|
| JP | 2001-2981974 | 10/2001 |
| JP | 2002-118255 | 4/2002 |
| JP | 2003-298051 | 10/2003 |

* cited by examiner

*Primary Examiner* — Thao P. Le
(74) *Attorney, Agent, or Firm* — Finnegan, Henderson, Farabow, Garrett & Dunner, L.L.P.

(57) ABSTRACT

A semiconductor device has plural columnar gate electrodes for plural MOSFETs formed in a row separately on a semiconductor substrate, and a semiconductor region which is formed in a part between the neighboring two columnar gate electrodes of the plural columnar gate electrodes to form a channel of the MOSFETs.

7 Claims, 26 Drawing Sheets

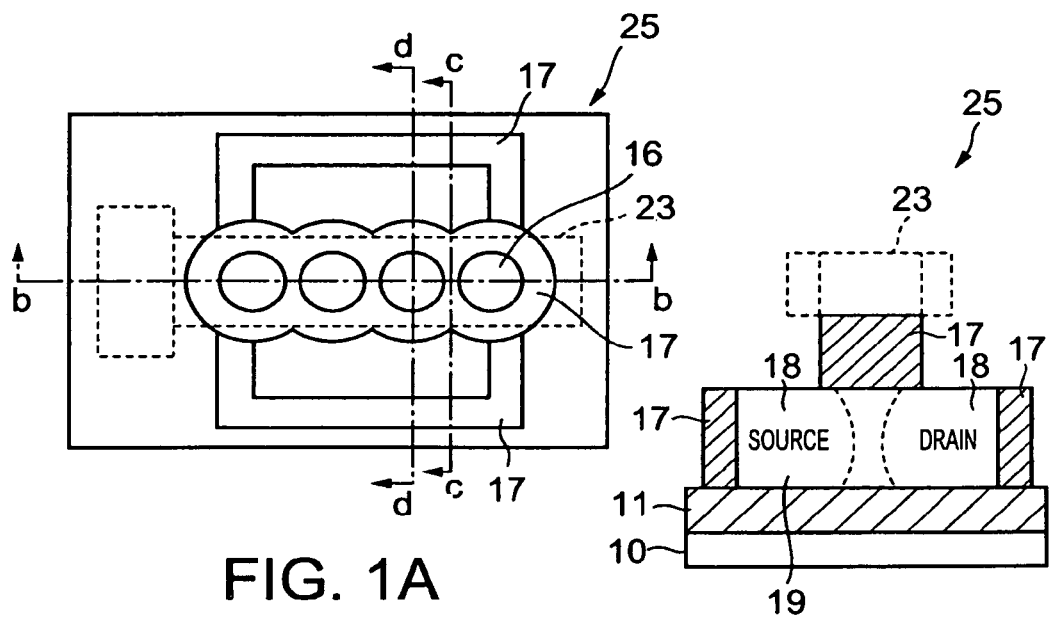
FIG. 1A
FIG. 1C
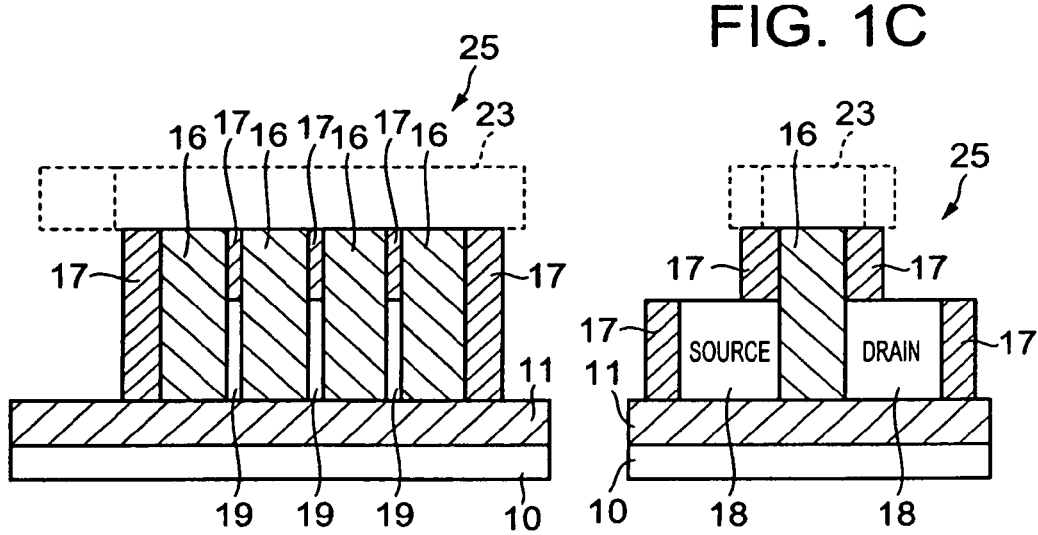
FIG. 1B
FIG. 1D

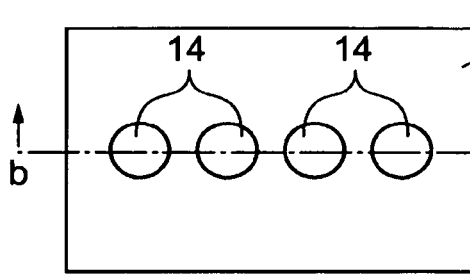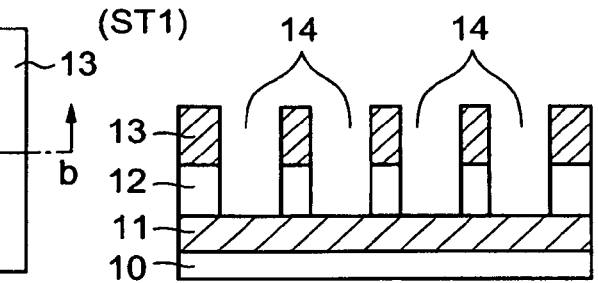
FIG. 2A     FIG. 2B
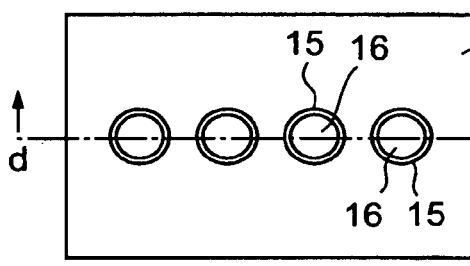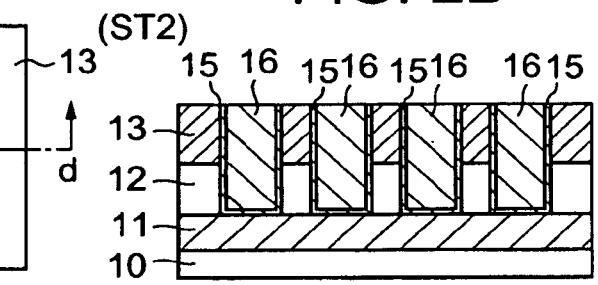
FIG. 2C     FIG. 2D
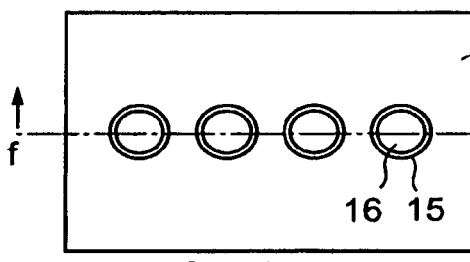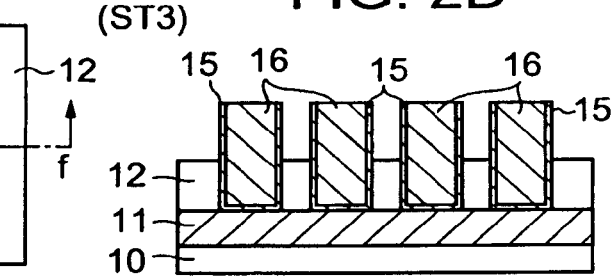
FIG. 2E     FIG. 2F
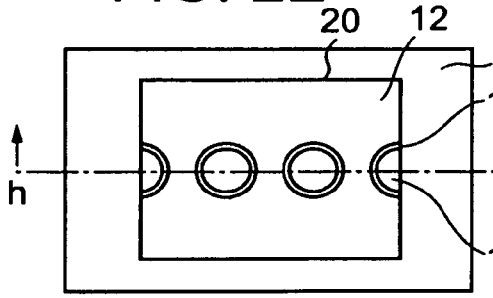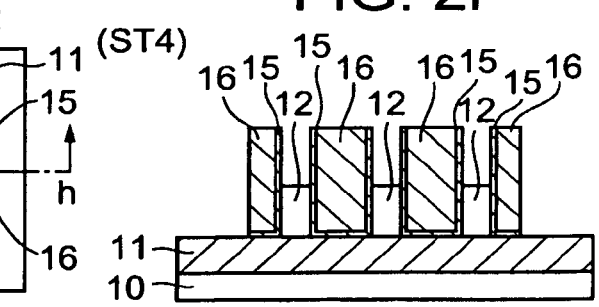
FIG. 2G     FIG. 2H
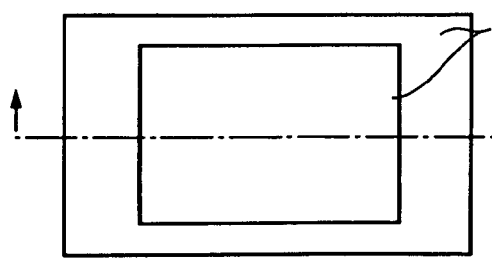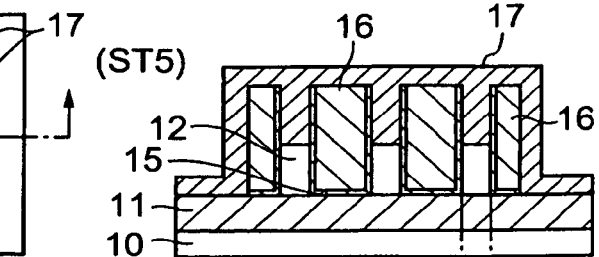
FIG. 2I     FIG. 2J (ST7)

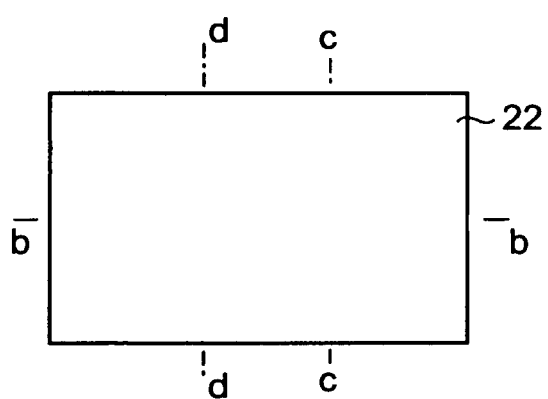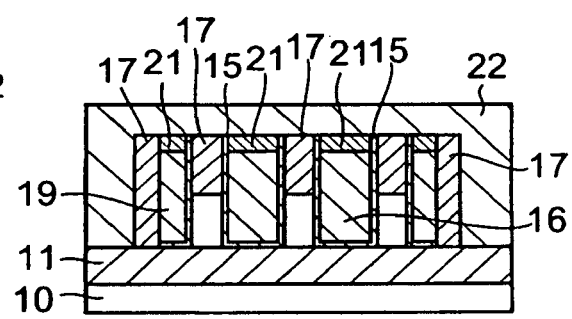
FIG. 6A    FIG. 6B
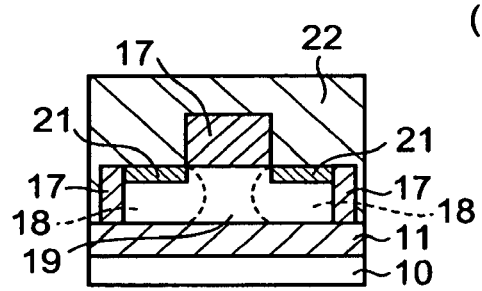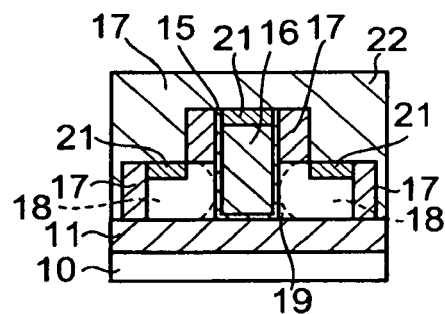
FIG. 6C    FIG. 6D

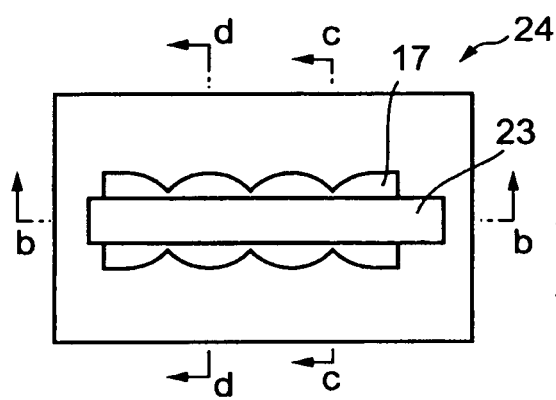
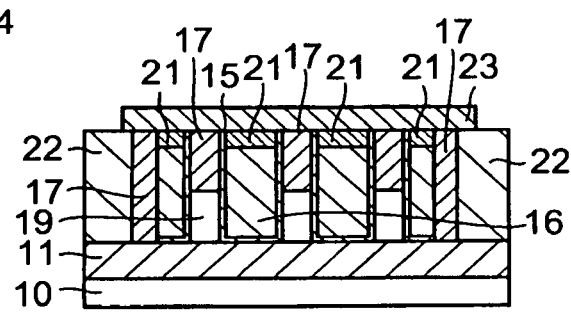
FIG. 8A  FIG. 8B
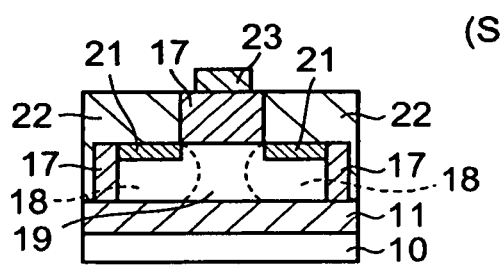
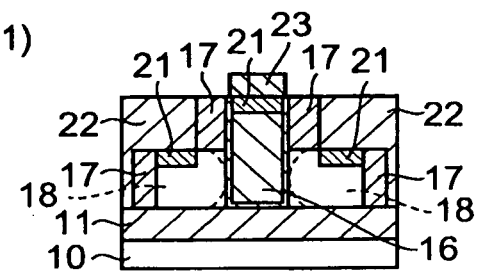
FIG. 8C  FIG. 8D (ADDED ST)

(ST6)

(d)

(ST7)

(ST4)

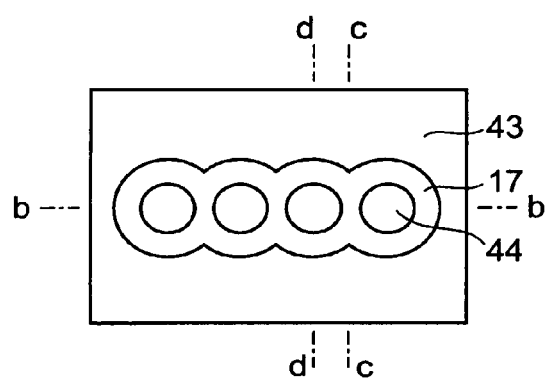
FIG. 23A  FIG. 23B
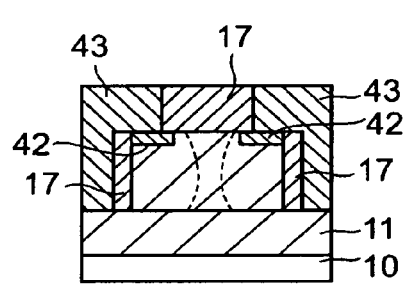 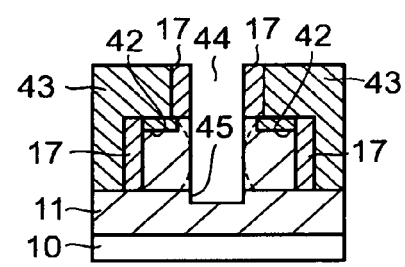
FIG. 23C  FIG. 23D

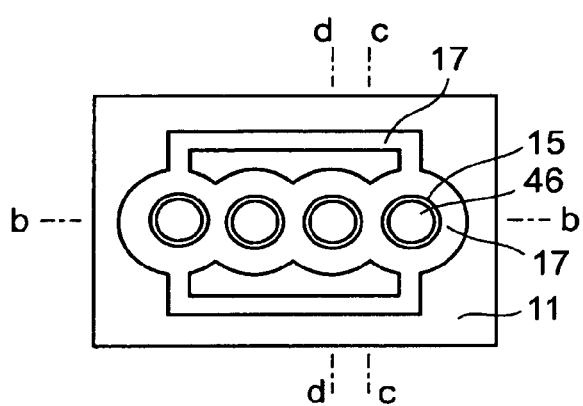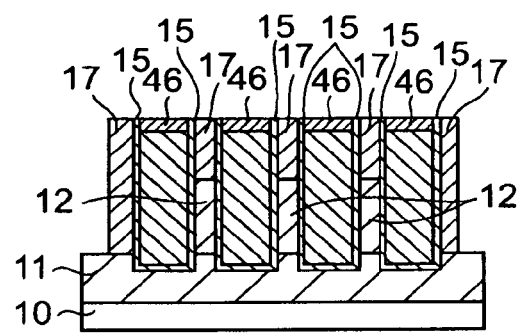
FIG. 25A FIG. 25B
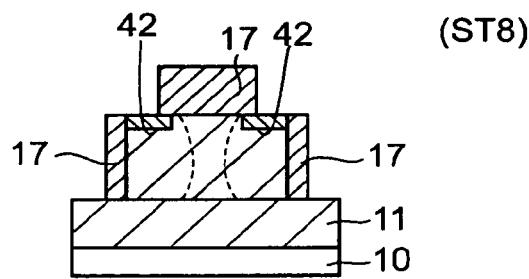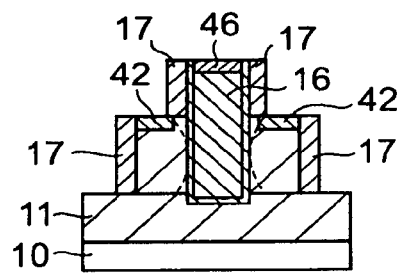
FIG. 25C FIG. 25D

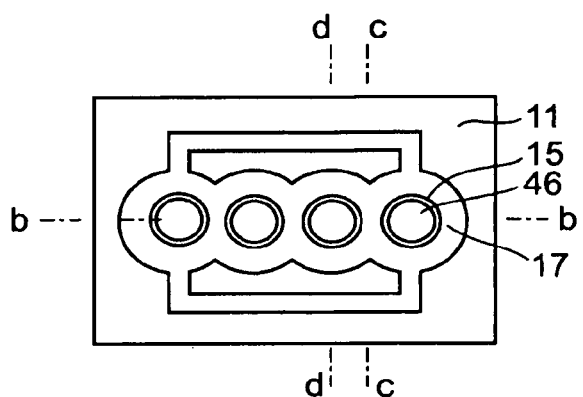
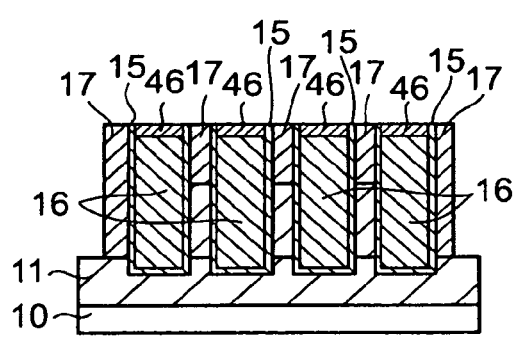
FIG. 26A  FIG. 26B
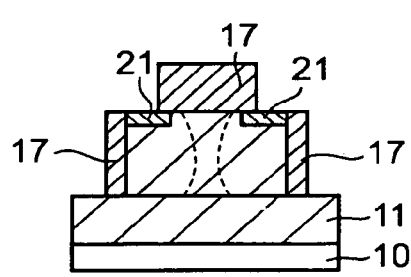
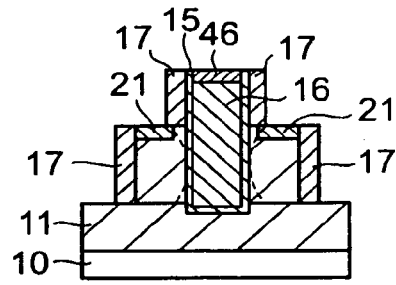
FIG. 26C  FIG. 26D
(ST9)

(ST10)

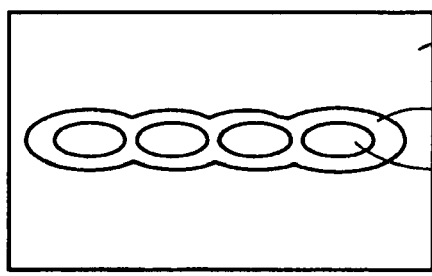
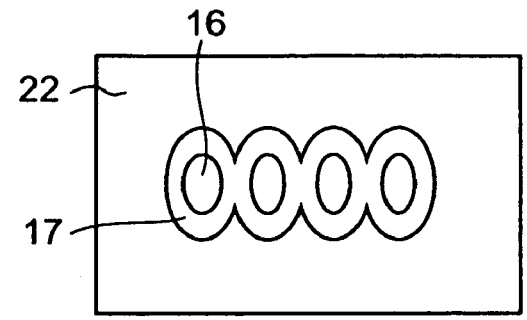
FIG. 28A                FIG. 28B
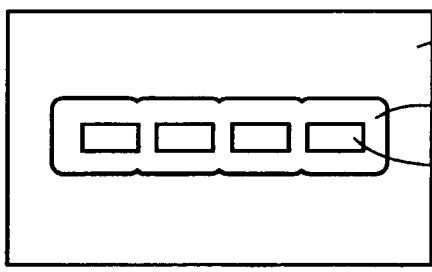
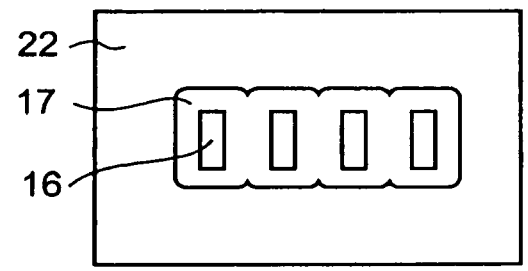
FIG. 28C                FIG. 28D
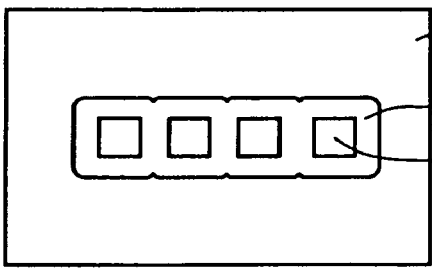
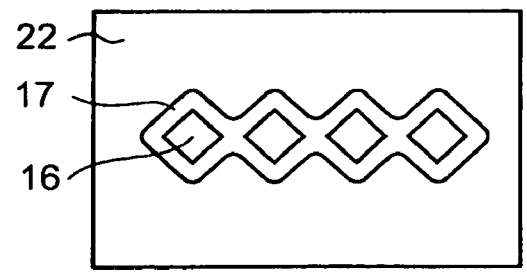
FIG. 28E                FIG. 28F

SEMICONDUCTOR DEVICE AND METHOD OF MANUFACTURING THE SAME

CROSS REFERENCE TO RELATED APPLICATIONS

This is a division of application Ser. No. 11/898,020, filed Sep. 7, 2007 now U.S. Pat. No. 7,642,162, which is incorporated herein by reference.

This application is based upon and claims the benefit of priority from the prior Japanese Patent Application No. 2006-243844 filed on Sep. 8, 2006, the entire contents of which are incorporated herein by reference.

BACKGROUND OF THE INVENTION

1. Field of the Invention

The present invention relates to a semiconductor device and a method of manufacturing the same, especially, relates to a semiconductor device and a method of manufacturing the same applied to device manufacturing that requires miniaturization.

2. Related Art

The conventional MOSFET (Metal Oxide layer Semiconductor Field Effect Transistor) has a gate electrode formed only in an upper part of a surface of a semiconductor principal plane functioned as a channel. However, with miniaturization of MOSFETs, there are high demand to realize a MOSFET with a double-gate structure having gate electrodes formed not only in an upper part of a surface of the semiconductor principal plane functioned as the channel but also on a lower surface of the channel. In the MOSFET with the double-gate structure, for example, it is confirmed that there is an advantage that it is possible to maintain a switching characteristic even against the fall in a voltage due to the miniaturization. For the double-gate MOSFET, besides a method of forming a surface of a semiconductor principal plane as a channel and forming gate electrodes on an upper surface and a lower surface of the channel, there has been proposed a FINFET (Fin Field Effect Transistor) structure in which a channel is formed vertically to a semiconductor principal plane (in a fin shape) and gates are formed on both sides of the channel (Japanese Patent Laid-Open No. 2002-118255, Japanese Patent Laid-Open No. 2003-298051, and Japanese Patent No. 3543946).

As characteristic of this FINFET structure, for example, it is easier to manufacture the FINFET structure than the method of manufacturing the MOSFET with the double-gate structure. The MOSFET with such a conventional FINFET structure has the characteristic that manufacturing thereof is easy as described above but has problems explained below.

In the conventional MOSFET 8 with FINFET structure, the gate electrode is formed after forming an SOI region in the FIN shape. In the case of patterning the gate electrode due to a lithography technique, the lithography is performed by aligning gate patterning locations to the FIN shape. However, an error may be involved in the alignment. As a result, in the FIN shape, it is necessary to incorporate an alignment margin in a pattern in advance taking this error into account. Therefore, it is necessary to set length F of FIN in a source to drain direction (a vertical direction on a paper surface) longer than width L of the gate electrode by length of an alignment error G.

In other words, there is a relation of F>L+G. As a result, in the MOSFET with the conventional FINFET structure, source and drain regions of the FIN shape are formed. In order to perform further miniaturization, it is necessary to reduce width H of FIN. On the other hand, parasitic resistance of the source and drain regions of the FIN shape increases as the FIN width H is reduced. Thus, it is impossible to realize high performance of the MOSFET even if the MOSFET is miniaturized. As described above, in the MOSFET with the conventional so-called double-gate structure, a margin for aligning the gate pattern is necessary. Therefore, it is impossible to shorten the FIN length even if the FIN width is narrowed due to the miniaturization, and there is a problem that a high parasitic resistance is generated.

SUMMARY OF THE INVENTION

According to one embodiment of the present invention, a semiconductor device, comprising:

plural columnar gate electrodes for plural MOSFETs formed in a row separately on a semiconductor substrate; and a semiconductor region which is formed in a part between the neighboring two columnar gate electrodes of the plural columnar gate electrodes to form a channel of the MOSFETs.

Furthermore, according to one embodiment of the present invention, a method of manufacturing a semiconductor device having columnar gate electrodes, comprising:

forming plural holes in a row on a surface of a semiconductor substrate;

filling a first conductor into the plural holes to form plural columnar gate electrodes;

exposing a part in at least side faces of the gate electrodes to expose the plural columnar gate electrodes on a surface of the semiconductor substrate;

forming a gate sidewall film made of an insulator having a thickness larger than a half of a distance between the neighboring two columnar gate electrodes; and planarizing upper ends of the plural columnar gate electrodes and forming a second gate electrode with a second conductor to junction upper ends of the plural columnar gate electrodes in a row.

BRIEF DESCRIPTION OF THE DRAWINGS

FIG. 1A is a plan view of a semiconductor device according to a first embodiment of the invention;

FIG. 1B is a sectional view along line b-b in FIG. 1A;

FIG. 1C is a sectional view along line c-c in FIG. 1A;

FIG. 1D is a sectional view along line d-d in FIG. 1A;

FIG. 2A is a plan view for explaining a first step ST1 in a method of manufacturing a semiconductor device according to the first embodiment;

FIG. 2B is a sectional view along line b-b in FIG. 2A;

FIG. 2C is a plan view for explaining a second step ST2;

FIG. 2D is a sectional view along line d-d in FIG. 2C;

FIG. 2E is a plan view for explaining a third step ST3;

FIG. 2F is a sectional view along line f-f in FIG. 2E;

FIG. 2G is a plan view for explaining a fourth step ST4;

FIG. 2H is a sectional view along line h-h in FIG. 2G;

FIG. 2I is a plan view for explaining a fifth step ST5;

FIG. 2J is a sectional view along line j-j in FIG. 2I;

FIG. 6A is a plan view for explaining a ninth step ST9 in the manufacturing method according to the first embodiment;
FIG. 6B is a sectional view along line b-b in FIG. 6A;
FIG. 6C is a sectional view along line c-c in FIG. 6A;
FIG. 6D is a sectional view along line d-d in FIG. 6A;
FIG. 8A is a plan view for explaining an eleventh step ST11 in the manufacturing method according to the first embodiment;
FIG. 8B is a sectional view along line b-b in FIG. 8A;
FIG. 8C is a sectional view along line c-c in FIG. 8A;
FIG. 8D is a sectional view along line d-d in FIG. 8A.

FIG. 23A is a plan view for explaining a sixth step ST6 in the manufacturing method according to the fourth embodiment;
FIG. 23B is a sectional view along line b-b in FIG. 23A;
FIG. 23C is a sectional view along line c-c in FIG. 23A;
FIG. 23D is a sectional view along line d-d in FIG. 23A;
FIG. 25A is a plan view for explaining an eighth step ST8 in the manufacturing method according to the fourth embodiment;
FIG. 25B is a sectional view along line b-b in FIG. 25A;
FIG. 25C is a sectional view along line c-c in FIG. 25A;
FIG. 25D is a sectional view along line d-d in FIG. 25A;
FIG. 26A is a plan view for explaining a ninth step ST9 in the manufacturing method according to the fourth embodiment;
FIG. 26B is a sectional view along line b-b in FIG. 26A;
FIG. 26C is a sectional view along line c-c in FIG. 26A;
FIG. 26D is a sectional view along line d-d in FIG. 26A;

FIGS. 28A to 28F are plan views of various plane shapes of columnar gate electrodes 16 in a semiconductor device according to a fifth embodiment of the invention, wherein the plane shapes are an ellipse elongated sideways, an ellipse elongated lengthwise, a rectangular elongated sideways, a rectangular elongated lengthwise, a regular square, and a regular square displaced by 45 degrees, respectively, in a direction of arrangement of the electrodes.

DETAILED DESCRIPTION OF THE INVENTION

Figures 3A, 3B:
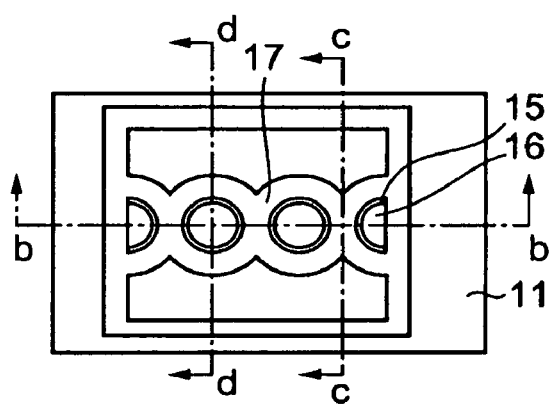
FIG. 3A is a plan view for explaining a sixth step ST6 in the manufacturing method according to the first embodiment.
FIG. 3B is a sectional view along line b-b in FIG. 3A.

A semiconductor device and a method of manufacturing the semiconductor device will be hereinafter explained in detail with reference to the accompanying drawings.

First Embodiment

The inventor has successfully found, with careful consideration and deliberation, a semiconductor device that can form source and drain regions without a problem of parasitic resistance in a self-align manner rather than adjusting a position of a gate to an SOI region having a FIN shape and patterning the gate as in the conventional technique and a method of manufacturing the semiconductor device. FIGS. 1A to 1D are diagrams showing a structure of a semiconductor device according to a first embodiment of the invention. FIG. 1A is a plan view of the semiconductor device, FIG. 1B is a sectional view along line b-b, FIG. 1C is a sectional view along line c-c and FIG. 1D is a sectional view along line d-d, respectively.

In FIGS. 1A to 1D, a semiconductor device 25 includes plural columnar gate electrodes 16 for MOSFETs formed in a row at fixed intervals on a semiconductor substrate 10 and semiconductor regions 19 each formed in a part between adjacent two columnar gate electrodes 16 of the plural columnar gate electrodes 16, and the semiconductor regions 19 correspond to channels of the MOSFETs.

Explaining a more detailed structure of the semiconductor device 25 according to the first embodiment, as shown in FIGS. 1B to 1D, the semiconductor device 25 includes the semiconductor substrate 10, a BOX oxide film 11 provided on the semiconductor substrate 10, the plural columnar gate electrodes 16 provided in parallel in a direction orthogonal to a plane of the BOX oxide film 11, gate sidewalls 17 that surround the plural columnar gate electrodes 16 and also surround a semiconductor region 18 (a lower half of an SOI region 12) to be source and drain regions and are also provided in an upper half of the semiconductor regions 19 (a lower half of parts among the columnar gate electrodes 16) to be channel regions, and a second gate electrode 23 made of, for example, a laminated film including a titanium nitride film and aluminum that extends in a longitudinal shape in a row direction in which the columnar gate electrodes 16 are provided and blocks exposed surfaces at upper ends of the columnar gate electrodes 16.

A method of manufacturing the semiconductor device according to the first embodiment having the structure described above will be explained in an order of steps with reference to FIGS. 2A to 2J to FIGS. 7A to 7D. A first step ST1 is shown in FIGS. 2A and 2B, a second step ST2 is shown in FIGS. 2C and 2D, a third step ST3 is shown in FIGS. 2E and 2F, a fourth step ST4 is shown in FIGS. 2G and 2H, a fifth step ST5 is shown in FIGS. 2I and 2J, a sixth step ST6 is shown in FIGS. 3A to 3D, a seventh step ST7 is shown in FIGS. 4A to 4D, an eighth step ST8 is shown in FIGS. 5A to 5D, a ninth step ST9 is shown in FIGS. 6A to 6D, a tenth step ST10 is shown in FIGS. 7A to 7D, and an eleventh step ST11 is shown in FIGS. 8A to 8D.

In the first step ST1, as shown in FIGS. 2A and 2B, first, a cover film 13 made of, for example, a silicon oxide nitride film is formed about 50 nm on the SOI region 12 using the semiconductor substrate 10, the BOX oxide film 11, and an SOI substrate having thickness of about 100 nm made of the SOI region 12. Subsequently, plural holes 14 with a diameter of about 20 nm shown in FIG. 2B are formed at intervals of about 25 nm to pierce through, for example, the SOI region 12.

In the second step ST2, as shown in FIGS. 2C and 2D, gate insulating films 15 made of, for example, a silicon nitride oxide film having thickness of about 1 nm are formed on bottom surfaces and sidewalls of the holes 14. Polysilicon having thickness of about 15 nm is filled in the holes 14 and upper surfaces of the polysilicon are planarized using the chemical mechanical polishing (hereinafter referred to as CMP) technique, the dry etching technique, or the like to form the plural gate electrodes 16, for example, in a columnar shape. Since the gate electrodes 16 are formed, for example, in a columnar shape, it is also possible to call the gate electrode 16 as a pillared gate electrode. In FIGS. 2C and 2D, the columnar gate electrodes 16 are formed by forming the insulating films 15 in the circular holes 14 and filling polysilicon in the holes 14. However, the columnar gate electrode is not limited to such a columnar shape. It is also possible to form the columnar gate electrodes 16 having various sectional shapes such as a square pole, a triangle pole, and a pole of a lozenge in section.

Phosphorus, arsenic, boron, or the like is implanted in the gate electrodes 16 made of polysilicon using the ion implantation technique to complete plural columnar gate electrodes. The gate insulating films 15 are formed by film formation as described above. However, the SOI region 12 exposed on the inner walls of the holes 14 may be oxidized and nitrided to form the gate insulating films 15 on inner walls of the holes 14. When the gate insulating films 15 are formed by oxidation and nitridation, oxidation by plasma oxide is desirable as a method of oxidation. This is because, in plasma oxidation, unlike thermal oxidation, since oxidized film thickness does not vary depending on a state of a crystal surface of silicon, plasma oxidation is desirable when silicon having various crystal orientations like the SOI region 12 exposed on the inner walls of the holes 14 is oxidized.

In the third step ST3, as shown in FIGS. 2E and 2F, the cover film 13 is removed by, for example, phosphoric acid. In this case, the cover film 13 may be removed by dry etching. According to the removal of the cover film 13, the plural columnar gate electrodes 16 are exposed together with the gate insulating films 15.

In the fourth step ST4, as shown in FIGS. 2G and 2H, patterning of a device isolation region is performed to remove the SOI region 12, the gate insulating films 15, and the gate electrodes 16 other than the device region 20 and leave only the SOI region 12, the gate insulating film 15, and the gate electrode 16 in the device region 20. Specifically, it is sufficient to leave resist only in the device region 20 using the lithography technique and remove silicon of the SOI region 12 and the gate insulating films 15 using dry etching or the like.

In the fifth step ST5, as shown in FIGS. 2I and 2J, a gate sidewall film 17 made of, for example, a silicon nitride film is formed over the entire gate about 10 nm in thickness. In this case, it is essential in embodiments of the invention to set thickness of the gate sidewall film 17 larger than a half of width J of the SOI region 12 between the adjacent two holes 14. In the first embodiment, since the width J is 5 nm, when the gate sidewall film 17 is formed 10 nm in thickness, spaces among columns of the adjacent plural columnar gate electrodes 16 are entirely filled with the gate sidewall film 17.

In the sixth step ST6, as shown in FIGS. 3A to 3D, etch-back is applied to the gate sidewall film 17 using the dry etching technique, whereby the gate sidewall film 17 remains only on sidewalls of the columns of the columnar gate electrodes 16. Viewed from above, as shown in FIG. 3A, the gate sidewall film 17 is filled among the adjacent columnar gate electrodes 16. As shown in FIG. 3B, which is an end view cut along line b-b in FIG. 3A, the gate sidewall film 17 is filled on an upper side and silicon of the SOI region 12 is filled on a lower side in a space between the adjacent two columnar gate electrodes 16 including the gate insulating films 15.

Figure 3C:
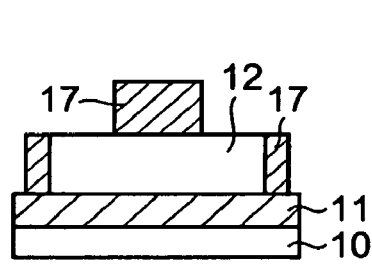
FIG. 3C is a sectional view along line c-c in FIG. 3A.
Figure 3D:
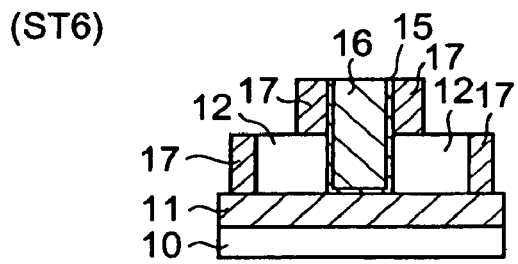
FIG. 3D is a sectional view along line d-d in FIG. 3A.

In FIG. 3C, which is an end view cut along line c-c in FIG. 3A, only the gate sidewall film 17 surrounding the columnar gate electrodes 16 and the gate insulating films 15 projects and a region around the gate sidewall film 17 is the SOI region 12 surrounded by the gate sidewall film 17. As shown in FIG. 3D, which is an end view cut along line d-d in FIG. 3A, in a sectional view cut in one columnar gate electrode 16, the gate insulating film 15 surrounds the gate electrode 16, the gate sidewall film 17 surrounds the gate insulating film 15 on the upper side, the SOI region 12 surrounds the gate insulating film 15 on the lower side, and the gate sidewall film 17 surrounds an outermost periphery of the SOI region 12.

In the seventh step ST7, as shown in FIGS. 4A to 4D, an impurity such as phosphorus, arsenic, or boron is implanted using the ion implantation technique or the like to form the source and drain regions 18. The impurity is not led into the space between the adjacent two columnar gate electrodes 16 because the gate sidewall film 17 is filled therein. Since the width among the adjacent gate electrodes is about 5 nm, a FINFET that has a channel having thickness of about 5 nm is formed.

Figure 4A:
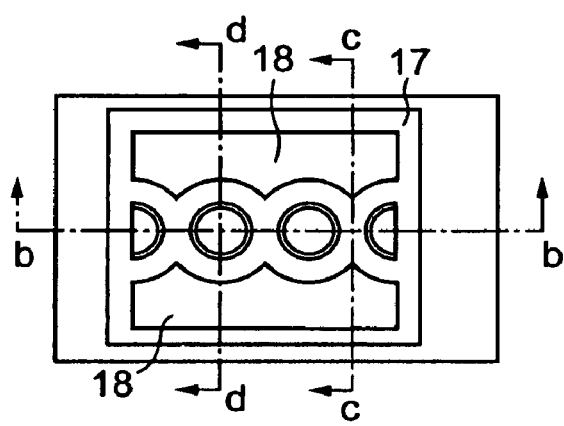
FIG. 4A is a plan view for explaining a seventh step ST7 in the manufacturing method according to the first embodiment.
Figure 4B:
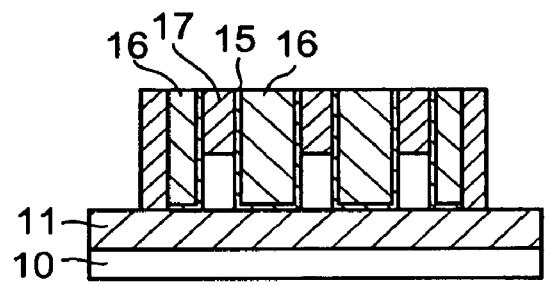
FIG. 4B is a sectional view along line b-b in FIG. 4A.
Figure 4C:
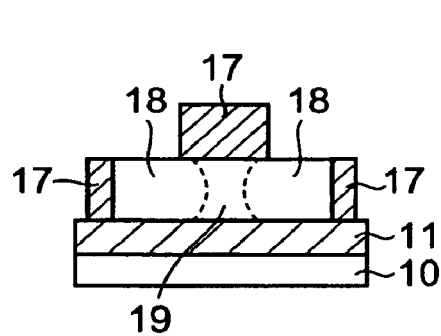
FIG. 4C is a sectional view along line c-c in FIG. 4A.
Figure 4D:
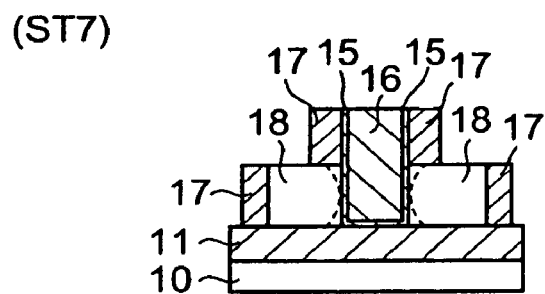
FIG. 4D is a sectional view along line d-d in FIG. 4A.
Figure 5A:
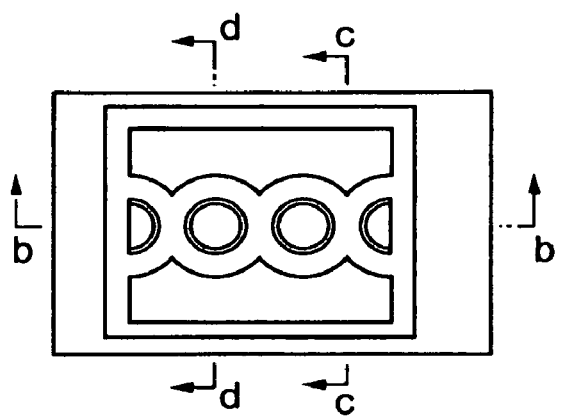
FIG. 5A is a plan view for explaining an eighth step ST8 in the manufacturing method according to the first embodiment.
Figure 5B:
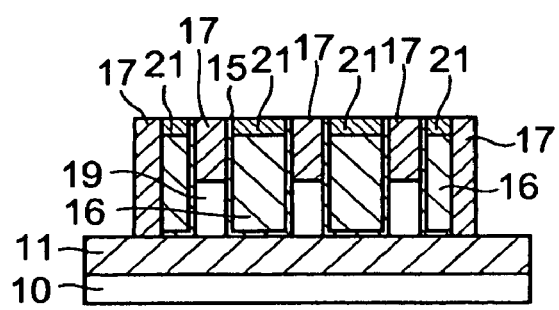
FIG. 5B is a sectional view along line b-b in FIG. 5A.
Figure 5C:
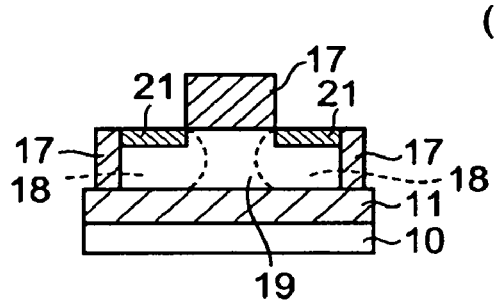
FIG. 5C is a sectional view along line c-c in FIG. 5A.
Figure 5D:
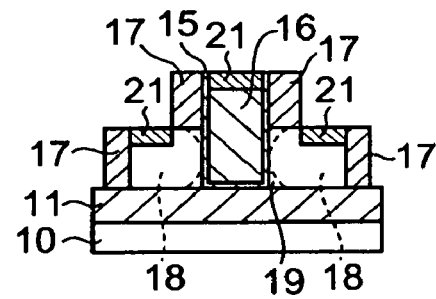
FIG. 5D is a sectional view along line d-d in FIG. 5A.
Figure 7A:
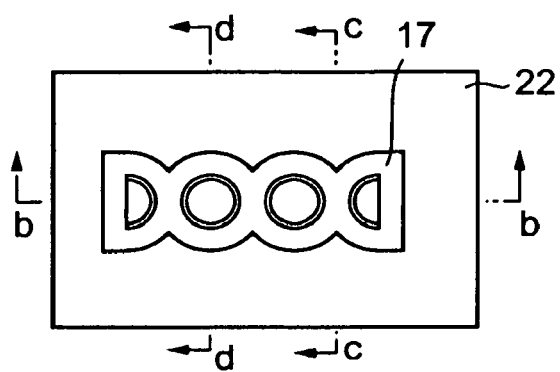
FIG. 7A is a plan view for explaining a tenth step ST10 in the manufacturing method according to the first embodiment.
Figure 7B:
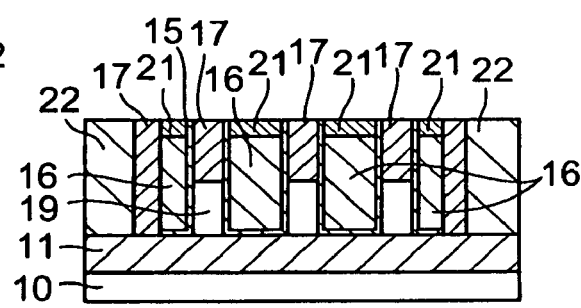
FIG. 7B is a sectional view along line b-b in FIG. 7A.
Figure 7C:
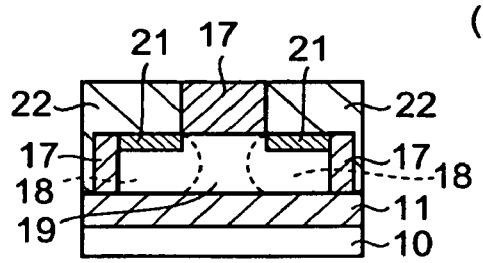
FIG. 7C is a sectional view along line c-c in FIG. 7A.
Figure 7D:
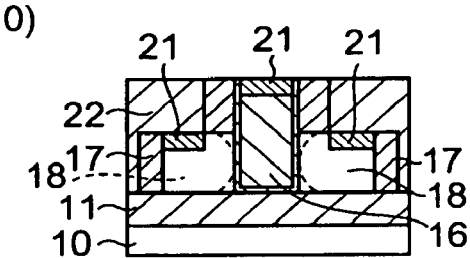
FIG. 7D is a sectional view along line d-d in FIG. 7A.
Figure 9A:
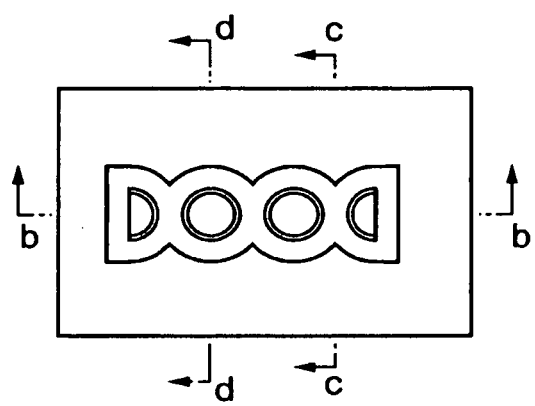
FIG. 9A is a plan view for explaining an additional step ST in a modification of the manufacturing method according to the first embodiment.
Figure 9B:
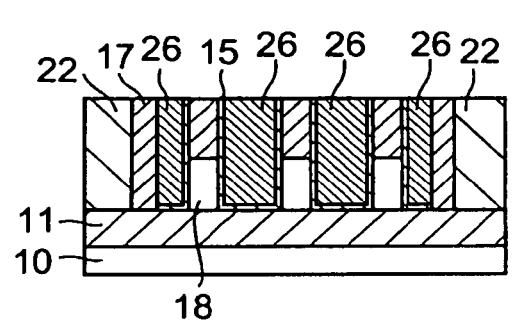
FIG. 9B is a sectional view along line b-b in FIG. 9A.
Figure 9C:
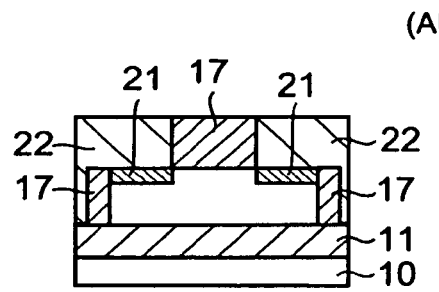
FIG. 9C is a sectional view along line c-c in FIG. 9A.
Figure 9D:
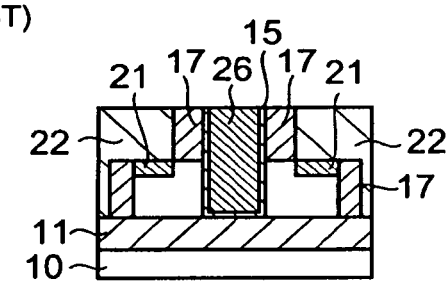
FIG. 9D is a sectional view along line d-d in FIG. 9A.

The channel region 19 sandwiched by the adjacent two columnar gate electrodes 16 is shown in FIG. 4C, which is a sectional view in a source-channel-drain direction. As shown in FIG. 4C, the channel region 19 sandwiched by the columnar gate electrodes 16 on a paper surface side and a paper rear surface side is formed to be sandwiched by the source and drain regions 18. The channel region 19 having the thickness of about 5 nm is formed only in a part where single-dashed lines b-b and c-c in a plan view in FIG. 4A cross. The channel region other than this part is thicker than at least 5 nm. Therefore, the problem of the increase in parasitic resistance of source and drain regions in the conventional FINFET does not occur.

It is possible to reduce an overlap capacity of the source and drain regions 18 and the gate electrode 16 by reducing a diameter of the holes 14. Consequently, an alternating current characteristic is improved. In other words, if it is possible to form the gate electrodes 16 with as small a diameter as possible including the gate insulating films 15, as a result, there is an effect that the alternating current characteristic is improved. Moreover, a pillared gate structure according to this embodiment is formed in the self-align manner regardless of alignment accuracy of the lithography technique.

Thus, the problem of an alignment error in the conventional technique does not occur. FIG. 4A plainly shows the concept of this embodiment.

Major characteristics of this embodiment are that a shape of the gate electrodes 16 viewed from above is a pillar shape, a sectional shape of which is a circle (or an ellipse or a square including a regular square, a rectangle, and a lozenge) and that the channel region 19 is formed in the self-align manner by filling the space between the adjacent two columnar gate electrodes 16 with the gate sidewall film 17. In the example explained in this first embodiment, the gate electrodes 16 are formed in a cylindrical shape.

In the eighth step ST8, as shown in FIGS. 5A to 5D, for example, nickel silicide (NiSi) films 21 are formed on upper surfaces of the source and drain regions 18 and the gate electrodes 16 using the salicide technique. As shown in a plan view in FIG. 5A, the NiSi films 21 are formed on the upper surfaces of the gate electrodes 16 other than the gate insulating film 15 and the gate sidewall film 17 formed in the self-align manner from the SOI region 12 and the upper surface of the source and drain regions 18.

In the ninth step ST9, as shown in FIGS. 6A to 6D, an interlayer film 22 made of, for example, a laminated film of a silicon nitride film and a silicon oxide film is formed. As shown in FIG. 6B, this interlayer film 22 is formed to cover the surfaces of the NiSi films 21 in the SOI region 12 while covering the entire plural columnar gate electrodes 16 and gate sidewall film 17 including the gate insulating films 15 and the NiSi films 21.

In the tenth step ST10, as shown in FIGS. 7A to 7D, planarization is applied to the interlayer film 22, which is formed at the upper ends of the gate electrodes 16 via the NiSi films 21 and covers the entire gate electrodes 16 and NiSi films 21 using CMP, dry etching, or the like until the upper surfaces of the columnar gate electrodes 16 are exposed. According to this planarization, the upper surfaces of the columnar gate electrodes 16 are exposed and all the upper surfaces of the interlayer film 22, the gate sidewall film 17, and the gate insulating films 15 are formed as a flat surface.

Subsequently, in the eleventh step ST11, as shown in FIGS. 8A to 8D, the second gate electrode 23 made of, for example, a laminated film of a titanium nitride film and aluminum is formed using, for example, the lithography technique. The columnar gate electrodes 16 are electrically connected to one another by this second gate electrode 23. In the structure of the pillared gate MOSFET 25 described with reference to FIGS. 1A to 1D, the NiSi films 21 and the interlayer film 22 are removed from the structure shown in FIGS. 8A to 8D and the device region 20 is formed to include the four columnar gate electrodes 16. FIG. 8A is a plan view of the pillared gate MOSFET 25, FIG. 8B is a sectional view along line b-b in FIG. 8A, FIG. 8C is a sectional view along line c-c in FIG. 8A, and FIG. 8D is a sectional view along line d-d in FIG. 8A.

A semiconductor device 24 in this state has a structure substantially identical with that of the semiconductor device 25 shown in FIGS. 1A to 1D when the NiSi films 21, the interlayer film 22, and the second gate electrode 23 are omitted in FIGS. 8A to 8D. Although not shown in the figures and not explained, in the semiconductor device 24, respective contacts to source, drain, and gate regions are formed and electrically connected in the same manner as the usual MOSFET manufacturing process to complete a MOSFET.

According to the process described above, it is possible to form the structure of a FINFET having a narrow channel of a FIN shape in a self-align manner while precisely performing pattern alignment of lithography without causing the problem of alignment deviation of lithography and the problem of parasitic resistance of source and drain regions that occur in the conventional technique.

In this embodiment, the columnar gate electrodes 16 are polysilicon electrodes. However, it is also possible to form a metal gate without depletion as a gate by adding a simple known process. This manufacturing process will be schematically explained hereinafter. In the steps ST1 to ST10, after the planarization of the interlayer film 22, a film of nickel (Ni) is formed to be equal to or larger in thickness than the height of the columnar gate electrodes 16 in the states shown in FIGS. 7A to 7D. In the first embodiment, since the thickness of the columnar gate electrode 16 is about 100 nm, the Ni film is deposited 100 nm or more in thickness. Subsequently, the columnar electrodes 16 and the Ni film are subjected to heat treatment at 500 degrees for several minutes to cause polysilicon forming the gate electrode 16 and Ni to react with each other to form all the columnar gate electrodes 16 with NiSi. Thereafter, if the Ni film that has not reacted is removed in the same manner as the usual salicide technique, a FINFET serving as NiSi columnar gate electrodes 26 entirely made of NiSi is formed as shown in FIGS. 9A to 9D in which additional steps are explained as a modification. The other components in FIGS. 9A to 9D are the same as those in the first to the eleventh steps, and the identical components are denoted by the identical reference numerals and signs to omit redundant explanations of the components.

In the explanation of the first embodiment, the SOI (Silicon On Insulator) substrate having the embedded insulating film is used. However, the embodiments of the invention are not limited to the case of using the SOI substrate. It is possible to obtain the same effect even in the case of using a silicon (Si) substrate of the usual bulk structure is used. A specific example in which a bulk substrate is used will be hereinafter explained as a second embodiment.

Second Embodiment

Figure 10A:
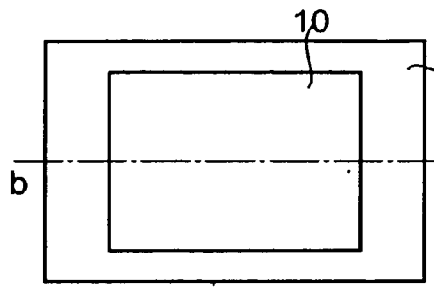
FIG. 10A is a plan view for explaining a first step ST1 in a method of manufacturing a semiconductor device according to a second embodiment of the invention.
Figure 10B:
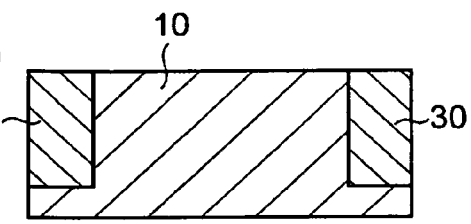
FIG. 10B is a sectional view along line b-b in FIG. 10A.

In the second embodiment, a method of manufacturing a semiconductor device using a silicon substrate is described. In a first step ST1, as shown in FIGS. 10A and 10B, first, a device isolation region 30 is formed in the semiconductor substrate 10.

Figure 10C:
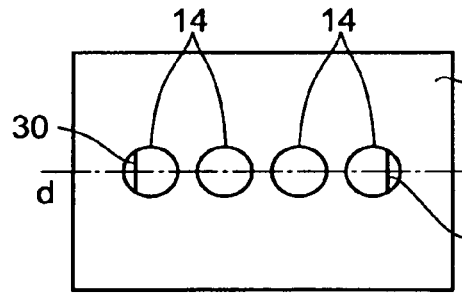
FIG. 10C is a plan view for explaining a second step ST2.
Figure 10D:
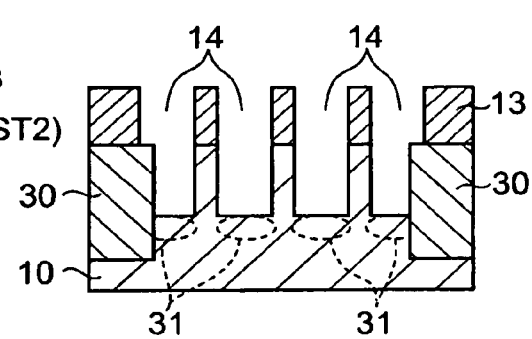
FIG. 10D is a sectional view along line d-d in FIG. 10C.

In a second step ST2, as shown in FIGS. 10C and 10D, the cover film 13 made of a silicon oxide nitride film is formed about 50 nm in the same manner as the first embodiment. Subsequently, the plural holes 14 having a diameter of about 20 nm are formed at intervals of about 25 nm as shown in the figures. After the holes 14 are formed, high-density punch-through stopper regions 31 of a conduction type opposite to that of source and drain regions may be formed at the bottoms of the respective holes 14 by ion implantation. The punch-through stopper regions 31 are regions for preventing the bottom surfaces of the holes from forming a channel and performing an MOSFET operation.

Figure 10E:
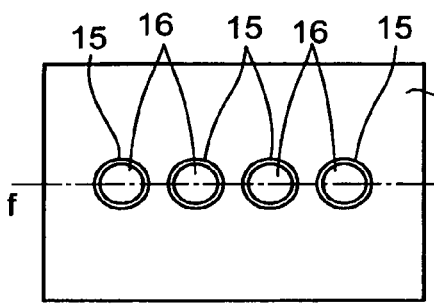
FIG. 10E is a plan view for explaining a third step ST3.
Figure 10F:
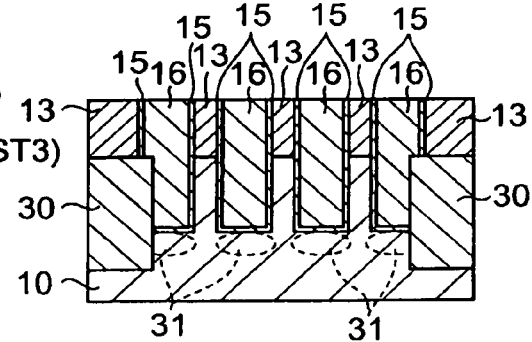
FIG. 10F is a sectional view along line f-f in FIG. 10E.

In a third step ST3, as shown in FIGS. 10E and 10F, the gate insulating films 15 made of, for example, a silicon nitride oxide film having thickness of about 1 nm are formed on the bottom surface and the sidewalls of the holes 14 in the same manner as the first embodiment. Subsequently, polysilicon having thickness of about 15 nm is filled in the holes 14 to form the gate electrodes 16.

Figure 10G:
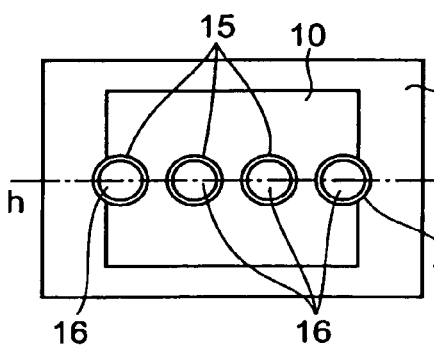
FIG. 10G is a plan view for explaining a fourth step ST4.
Figure 10H:
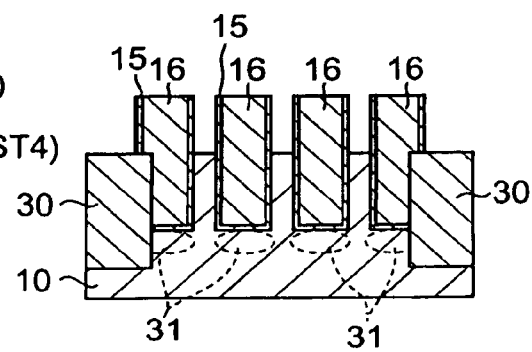
FIG. 10H is a sectional view along line h-h in FIG. 10G.
Figure 11A:
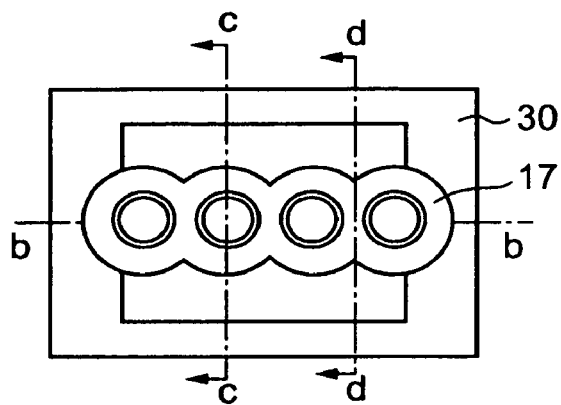
FIG. 11A is a plan view for explaining a fifth step ST5 in the manufacturing method according to the second embodiment.
Figure 11C:
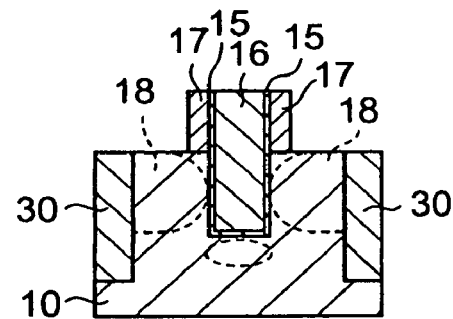
FIG. 11C is a sectional view along line c-c in FIG. 11A.
Figure 11B:
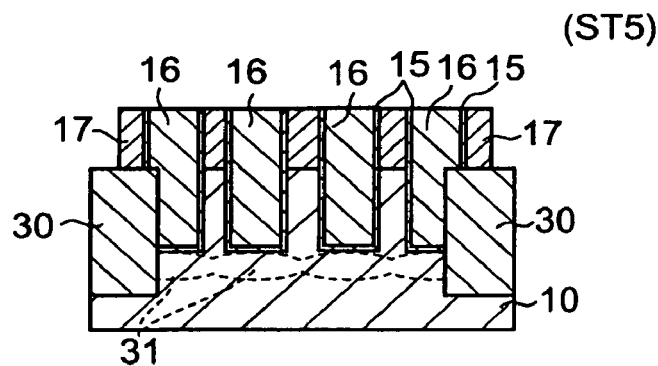
FIG. 11B is a sectional view along line b-b in FIG. 11A.
Figure 11D:
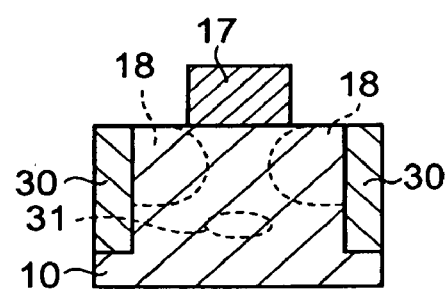
FIG. 11D is a sectional view along line d-d in FIG. 11A.
Figure 12A:
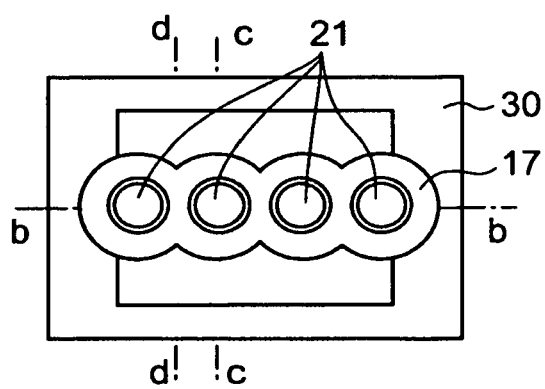
FIG. 12A is a plan view for explaining a sixth step ST6 in the manufacturing method according to the second embodiment.
Figure 12C:
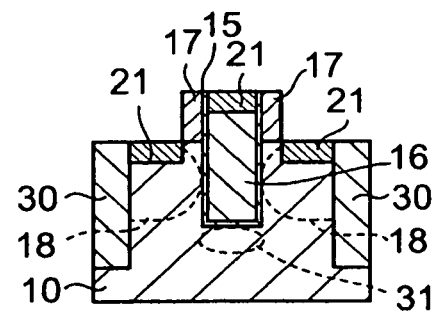
FIG. 12C is a sectional view along line c-c in FIG. 12A.
Figure 12B:
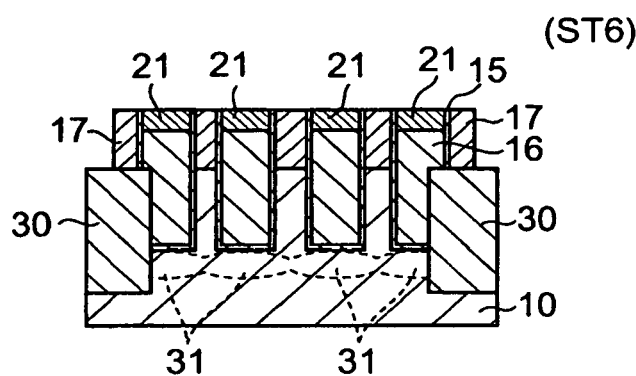
FIG. 12B is a sectional view along line b-b in FIG. 12A.
Figure 12D:
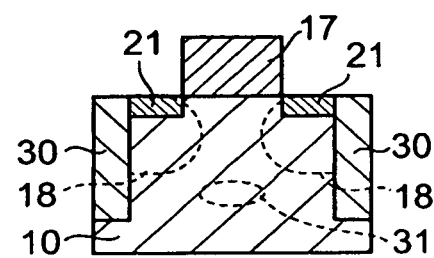
FIG. 12D is a sectional view along line d-d in FIG. 12A.

In a fourth step ST4, as shown in FIGS. 10G and 10H, the cover film 13 is removed by, for example, phosphoric acid or by dry etching or the like. Any means may be adopted for removing the cover film 13. Consequently, as shown in the figures, the gate electrodes 16 like pillars having the gate oxide films 15 around are exposed.

In a fifth step ST5, as shown in FIGS. 11A to 11D, the gate sidewall film 17 made of, for example, a silicon nitride film is formed around the columnar gate electrodes 16 having the gate oxide films 15 around in the same manner as the first embodiment. Subsequently, an impurity such as phosphorus, arsenic, or boron is implanted using the ion implantation technique or the like to form the source and drain regions 18, whereby a FINFET is formed. In forming the FINFET, it is likely that channels are formed on the bottom surfaces of the gate electrodes 16. In this second embodiment, since the punch-through stopper region 31 of a conduction type opposite to that of high-density source and drain regions is formed, a threshold of a transistor of this region 31 is sufficiently higher than that of a FINFET channel portion and can be prevented from acting as a channel. It goes without saying that, if the gate electrodes 16 are used in a region not refined in particular, the bottom surfaces of the gate electrodes 16 may be formed as channels. In that case, the punch-through stopper region 31 only has not to be formed or an impurity of a conduction type similar to that of low-density source and drain regions only has to be led into this region 31.

In a sixth step ST6, as shown in FIGS. 12A to 12D, for example, the NiSi films 21 are formed on the upper surfaces of the source and drain regions 18 and the gate electrode 16 by using the salicide technique.

Figure 13A:
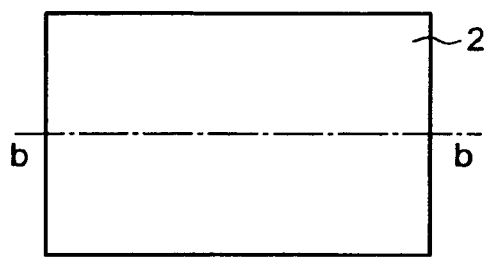
FIG. 13A is a plan view for explaining a seventh step ST7 in the manufacturing method according to the second embodiment.
Figure 13B:
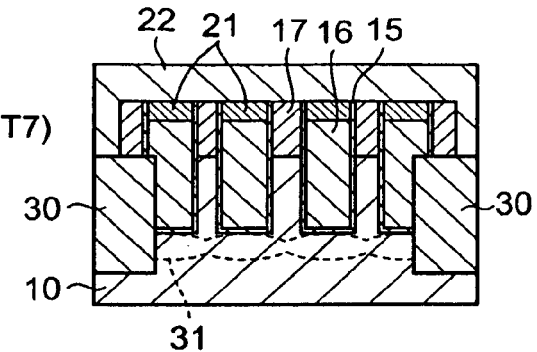
FIG. 13B is a sectional view along line b-b in FIG. 13A.
Figure 14A:
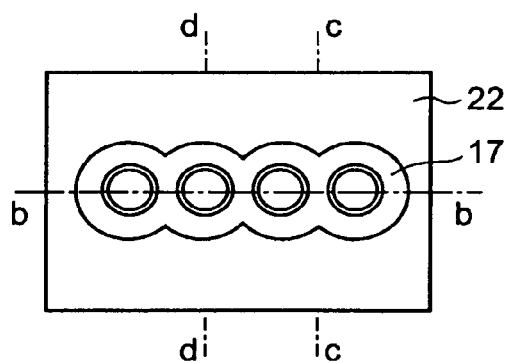
FIG. 14A is a plan view for explaining an eighth step ST8 in the manufacturing method according to the second embodiment.
Figure 14B:
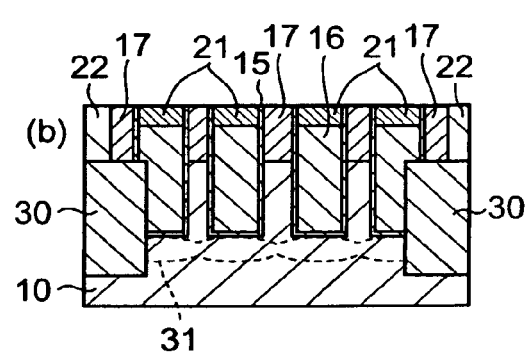
FIG. 14B is a sectional view along line b-b in FIG. 14A.
Figure 14C:
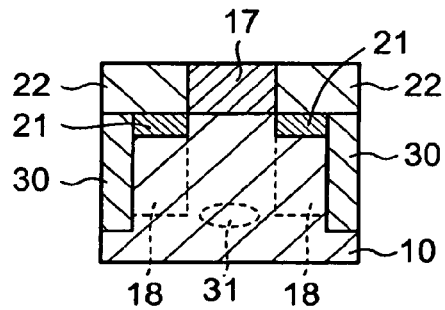
FIG. 14C is a sectional view along line c-c in FIG. 14A.
Figure 14D:
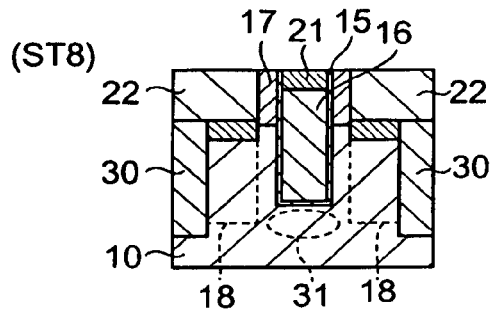
FIG. 14D is a sectional view along line d-d in FIG. 14A.
Figure 15A:
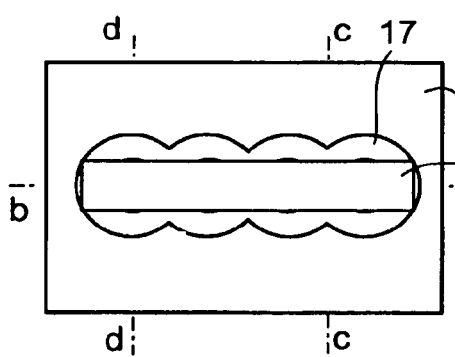
FIG. 15A is a plan view for explaining a ninth step ST9 in the manufacturing method according to the second embodiment.
Figure 15B:
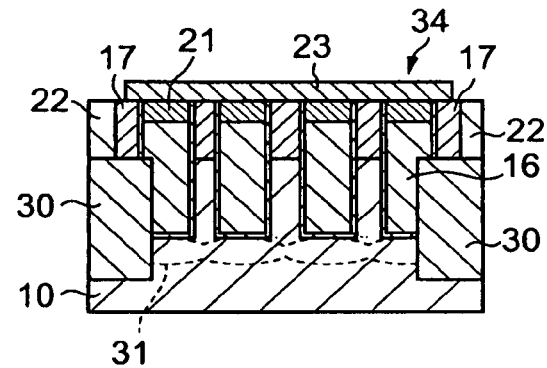
FIG. 15B is a sectional view along line b-b in FIG. 15A.
Figure 15C:
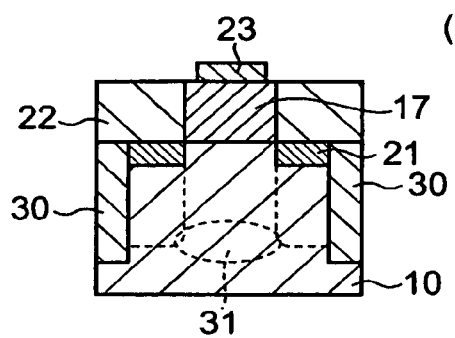
FIG. 15C is a sectional view along line c-c in FIG. 15A.
Figure 15D:
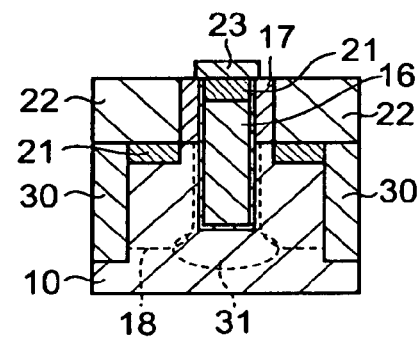
FIG. 15D is a sectional view along line d-d in FIG. 15A.

Subsequently, through steps same as those in the first embodiment, an MOSFET is completed. In a seventh step ST7, for example, the interlayer film 22, which is a laminated film of a silicon nitride film and a silicon oxide film, is formed. As shown in FIGS. 13A and 13B, this interlayer film 22 is formed to cover the surfaces of the NiSi films 21 of the SOI region 12 while covering the entire plural columnar gate electrodes 16 and gate sidewall film 17 including the gate insulating films 15 and the NiSi films 21.

In an eight step ST8, as shown in FIGS. 14A to 14D, planarization is applied to the interlayer film 22, which is formed at the upper ends of the gate electrodes 16 via the NiSi films 21 and covers the entire gate electrodes 16 and NiSi films 21, using CMP, dry etching, or the like until the upper surfaces of the columnar gate electrodes 16 are exposed. According to this planarization, the NiSi films 21 formed on the upper surfaces of the columnar gate electrodes 16 are exposed and all the upper surfaces of the interlayer film 22, the gate sidewall film 17, and the gate insulating films 15 are formed as flat surfaces.

Subsequently, in a ninth step ST9, as shown in FIGS. 15A to 15D, the second gate electrode 23 made of, for example, a laminated film of a titanium nitride film and aluminum is formed using, for example, the lithography technique. The columnar gate electrodes 16 are electrically connected to one another by this second gate electrode 23. The semiconductor device 34 in this state has a structure substantially identical with that of the semiconductor device 25 shown in FIGS. 1A to 1D when the NiSi film 21, the interlayer film 22, and the second gate electrode 23 are not shown in the figures. Although not shown in the figure and not explained, in the semiconductor device 24, respective contacts to source, drain, and gate regions are formed and electrically connected in the same manner as the usual MOSFET manufacturing process to complete a MOSFET.

As explained above, according to the respective steps in the second embodiment shown in FIGS. 10A to 10H to FIGS. 15A to 15D, it is also possible to form the FINFET according to the embodiments of the invention even when the silicon substrate is used. It is possible to obtain the same effect using the strained silicon technique, which is a known technique. A method of manufacturing a FINFET according to the strained silicon technique will be hereinafter explained as a third embodiment.

Third Embodiment

In the third embodiment, the first to the third steps ST1 to ST3 are the same as those in the second embodiment. Thus, redundant explanations related to FIGS. 10A to 10F are omitted and steps from a fourth step ST4 will be explained using FIGS. 16A and 16B to FIGS. 19A to 19D.

Figure 16A:
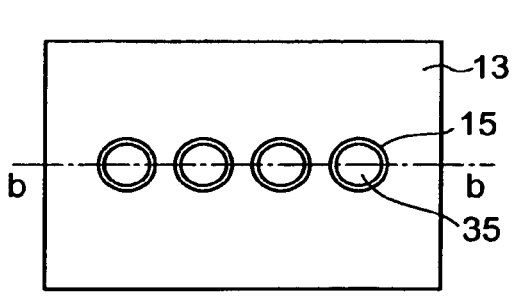
FIG. 16A is a plan view for explaining a fourth step ST4 in a method of manufacturing a semiconductor device according to a third embodiment of the invention.
Figure 16B:
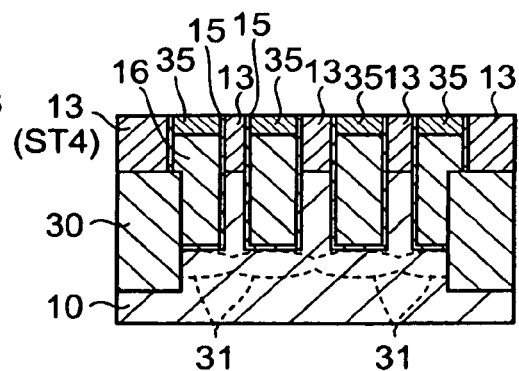
FIG. 16B is a sectional view along line b-b in FIG. 16A.

In the fourth step ST4 in the third embodiment, as shown in FIGS. 16A and 16B, oxidation is performed to form gate cap films 35 made of an oxide film on the upper surfaces of the gate electrodes 16 made of polysilicon.

Figure 17A:
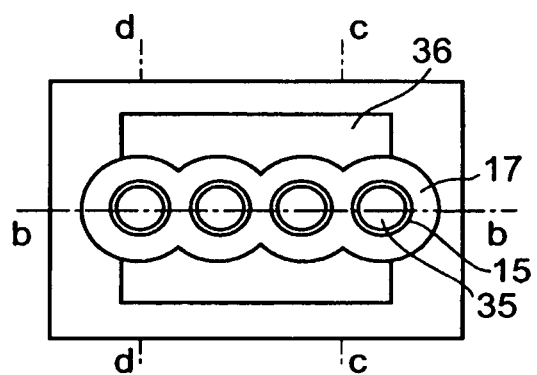
FIG. 17A is a plan view for explaining a fifth step ST5 in the manufacturing method according to the third embodiment.
Figure 17B:
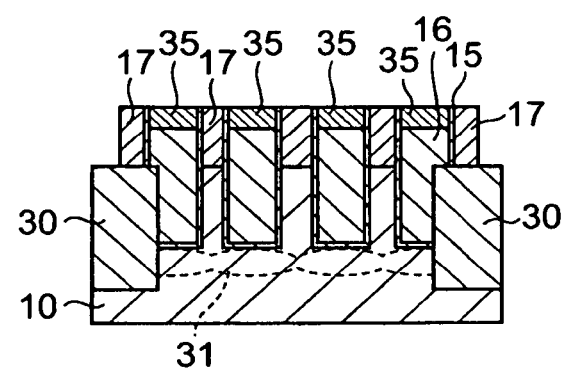
FIG. 17B is a sectional view along line b-b in FIG. 17A.
Figure 17C:
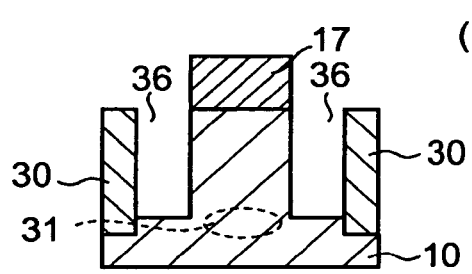
FIG. 17C is a sectional view along line c-c in FIG. 17A.
Figure 17D:
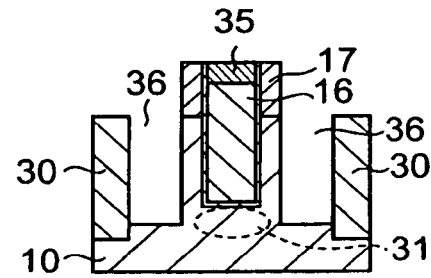
FIG. 17D is a sectional view along line d-d in FIG. 17A.

In a fifth step ST5, as shown in FIGS. 17A to 17D, etching is selectively applied to silicon on both upper and lower sides by sandwiching the gate sidewall film 17 in FIG. 17A to form recess regions 36 shown in the figures. As shown in FIGS. 17C and 17D, depth of the recess regions 36 is equivalent to depth reaching both sides of the punch-through stopper region 31.

Figure 18A:
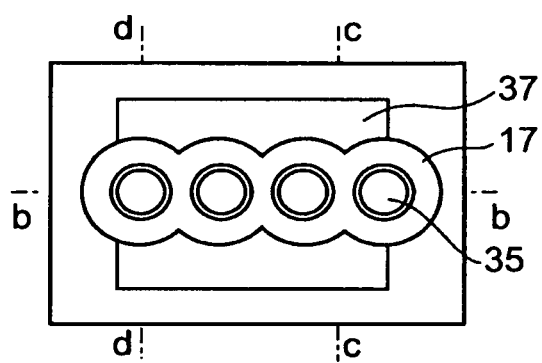
FIG. 18A is a plan view for explaining a sixth step ST6 in the manufacturing method according to the third embodiment.
Figure 18B:
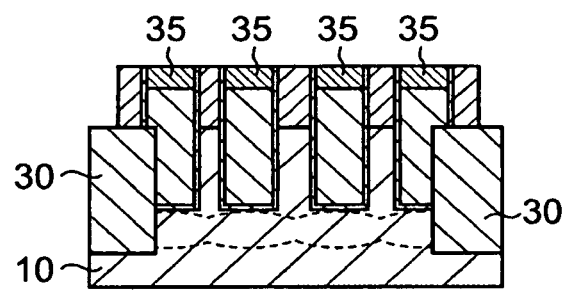
FIG. 18B is a sectional view along line b-b in FIG. 18A.
Figure 18C:
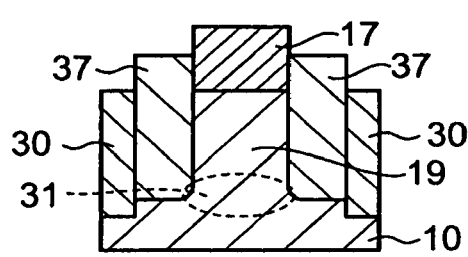
FIG. 18C is a sectional view along line c-c in FIG. 18A.
Figure 18D:
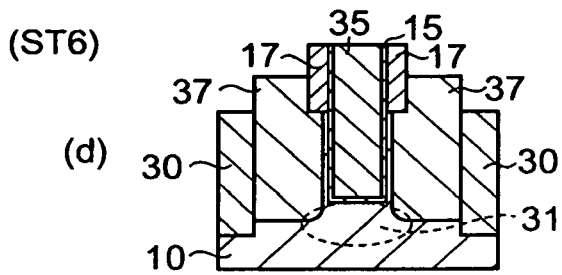
FIG. 18D is a sectional view along line d-d in FIG. 18A.
Figure 19A:
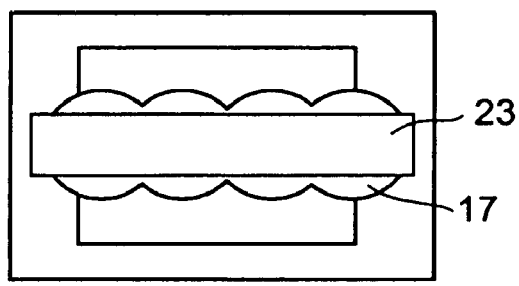
FIG. 19A is a plan view for explaining a seventh step ST7 in the manufacturing method according to the third embodiment.
Figure 19B:
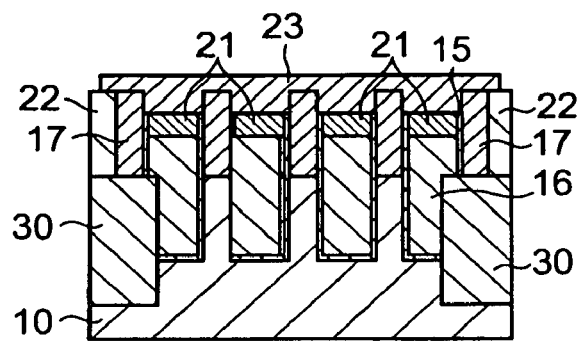
FIG. 19B is a sectional view along line b-b in FIG. 19A.
Figure 19C:
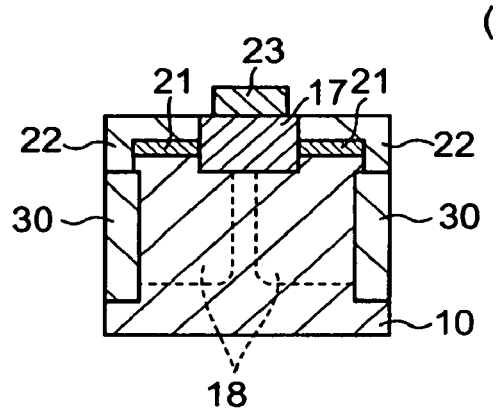
FIG. 19C is a sectional view along line c-c in FIG. 19A.
Figure 19D:
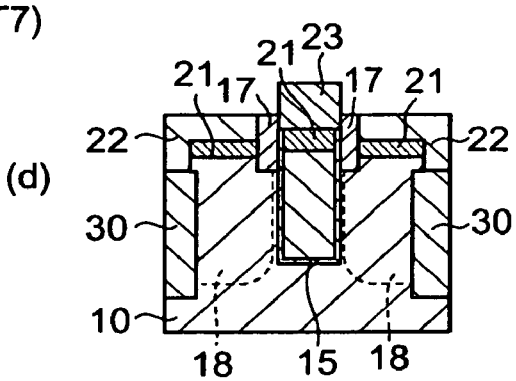
FIG. 19D is a sectional view along line d-d in FIG. 19A.

In a sixth step ST6, as shown in FIGS. 18A to 18D, for example, in the case of a p-type FET, epitaxial film formation of several tens % of germanium (Ge) containing about 1% of boron and silicon (Si) is performed to form p-type SiGe layers 37 in source and drain regions. In the case of an n-type FET, epitaxial growth of several % of carbon containing about 1% of phosphorus, arsenic, or the like and silicon (Si) is performed to form SiC layers 37. Consequently, as shown in FIG. 18C, the channel region 19 made of silicon (Si) is subjected to stress and distorted by the SiGe layer or the SiC layer 37 formed in the source and drain regions and a mobility of silicon (Si) in the channel region 19 is improved.

In a seventh step ST7, as shown in FIGS. 19A to 19D, after the gate cap films 35 are removed, for example, NiSi films 21 are formed on the upper surfaces of the source and drain regions 18 and the upper surfaces of the gate electrodes 16 using the salicide technique in the same manner as the first and the second embodiments. Subsequently, the same steps as those in the first and the second embodiments are performed to complete a MOSFET.

As explained above, it is seen that it is possible to introduce the known strained silicon technique into the embodiments of the invention by manufacturing a semiconductor device as indicated by the method according to the third embodiment. Moreover, it is also possible to use the known damascene gate process in the method of manufacturing a semiconductor device according to the embodiments of the invention.

Fourth Embodiment

Figure 20A:
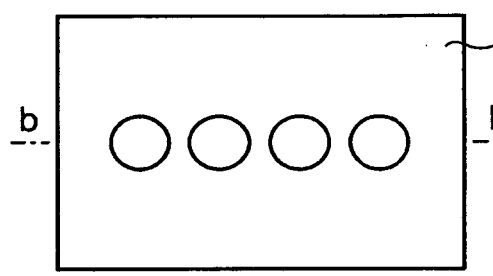
FIG. 20A is a plan view for explaining a first step ST1 in a method of manufacturing a semiconductor device according to a fourth embodiment of the invention.
Figure 20B:
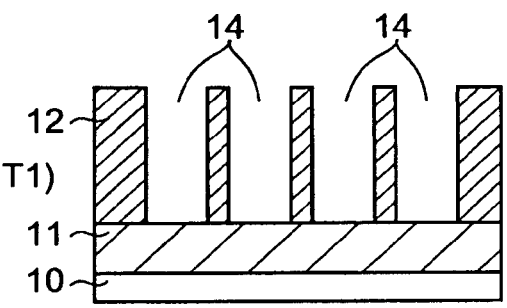
FIG. 20B is a sectional view along line b-b in FIG. 20A.

In a fourth embodiment of the invention, a method of manufacturing a semiconductor device that uses the known damascene gate process will be hereinafter explained. First, in a first step ST1, as shown in FIGS. 20A and 20B, in the same manner as the first embodiment, using an SOI substrate made of the semiconductor substrate 10, the BOX oxide film 11, and the SOI (Silicon on Insulator) region 12 having thickness of about 100 nm, the plural holes 14 having diameter of about 20 nm are formed at intervals of about 25 nm to pierce through, for example, the SOI region 12. The cover film 13 used in the first embodiment may be omitted.

Figure 20C:
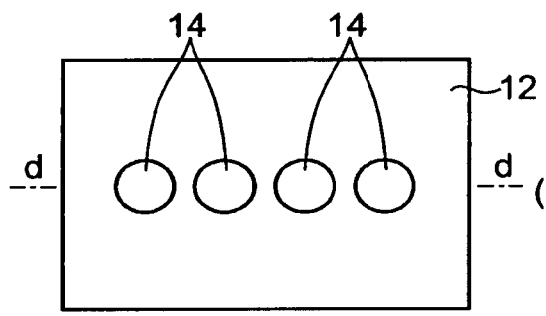
FIG. 20C is a plan view for explaining a second step ST2.
Figure 20D:
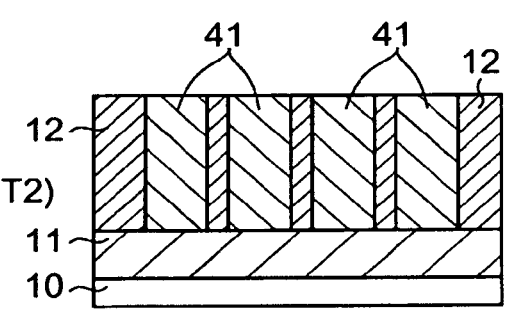
FIG. 20D is a sectional view along line d-d in FIG. 20C.

In a second step ST2, although the gate electrodes 16 are embedded in the first embodiment, in the fourth embodiment, as shown in FIGS. 20C and 20D, for example, an oxide film is embedded as dummy gate electrodes 41.

Figure 20E:
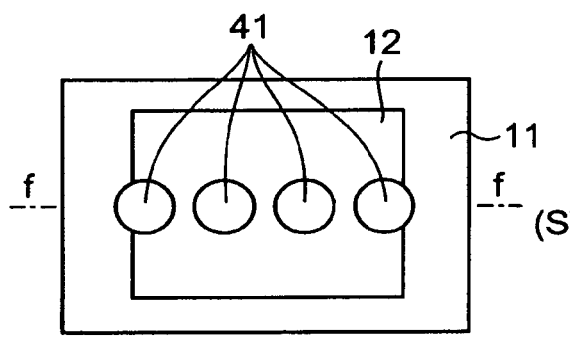
FIG. 20E is a plan view for explaining a third step ST3.
Figure 20F:
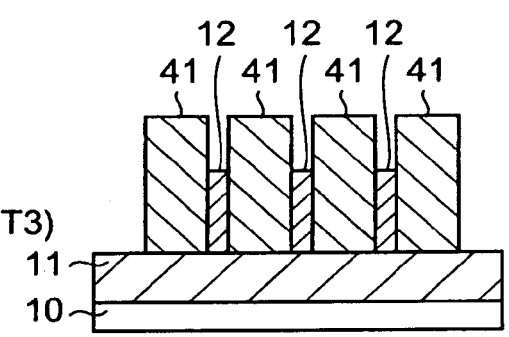
FIG. 20F is a sectional view along line f-f in FIG. 20E.
Figure 21A:
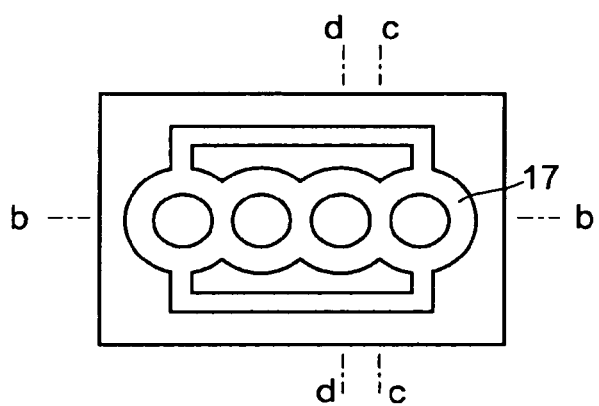
FIG. 21A is a plan view for explaining a fourth step ST4 in the manufacturing method according to the fourth embodiment.
Figure 21B:
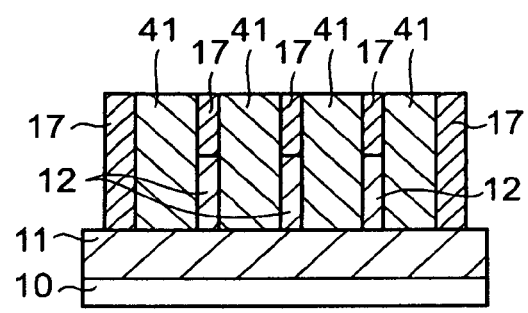
FIG. 21B is a sectional view along line b-b in FIG. 21A.
Figure 21C:
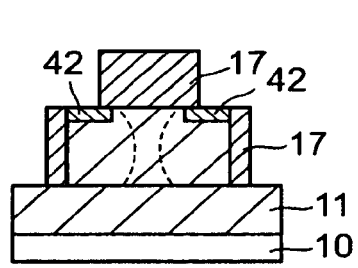
FIG. 21C is a sectional view along line c-c in FIG. 21A.
Figure 21D:
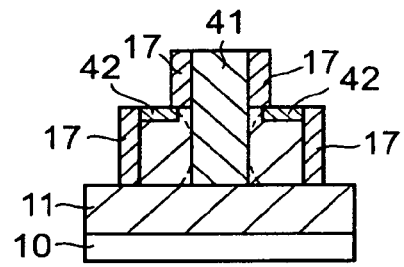
FIG. 21D is a sectional view along line d-d in FIG. 21A.
Figure 22A:
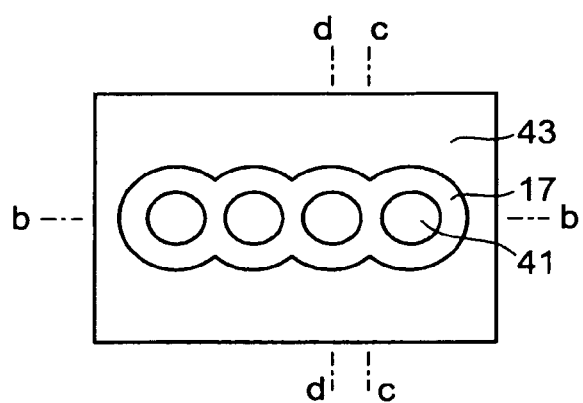
FIG. 22A is a plan view for explaining a fifth step ST5 in the manufacturing method according to the fourth embodiment.
Figure 22B:
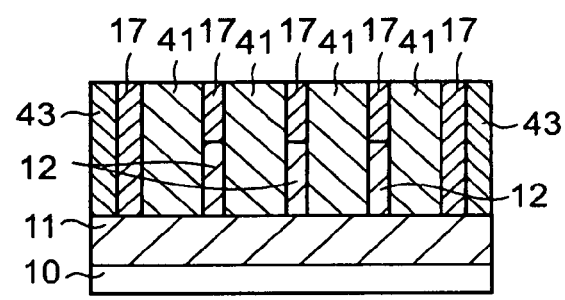
FIG. 22B is a sectional view along line b-b in FIG. 22A.
Figure 22C:
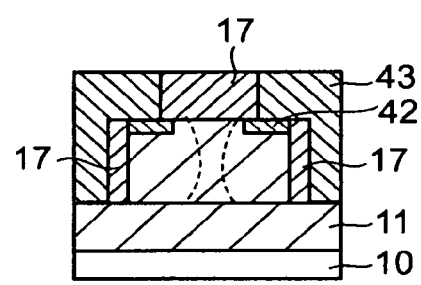
FIG. 22C is a sectional view along line c-c in FIG. 22A.
Figure 22D:
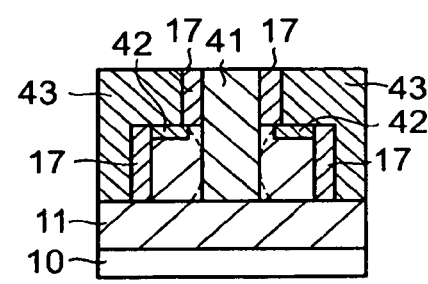
FIG. 22D is a sectional view along line d-d in FIG. 22A.
Figure 24A:
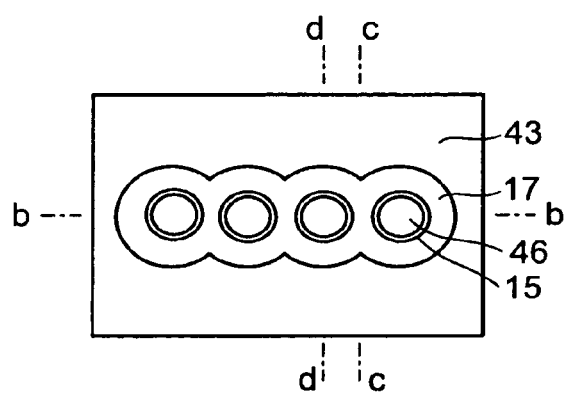
FIG. 24A is a plan view for explaining a seventh step ST7 in the manufacturing method according to the fourth embodiment.
Figure 24B:
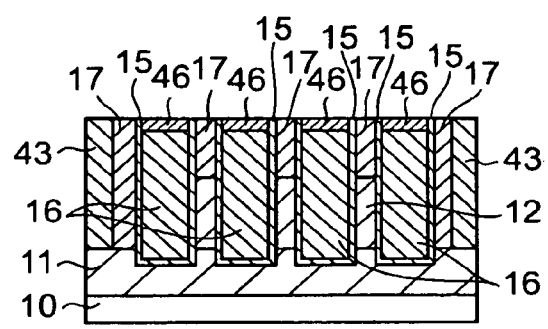
FIG. 24B is a sectional view along line b-b in FIG. 24A.
Figure 24C:
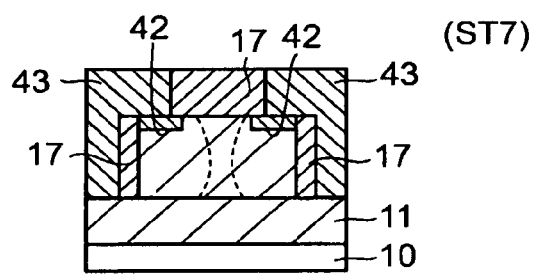
FIG. 24C is a sectional view along line c-c in FIG. 24A.
Figure 24D:
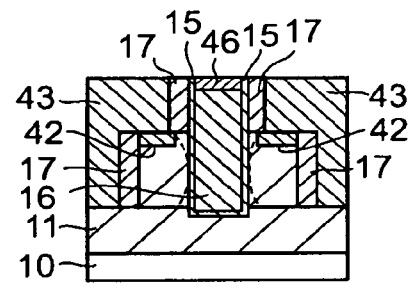
FIG. 24D is a sectional view along line d-d in FIG. 24A.
Figure 27A:
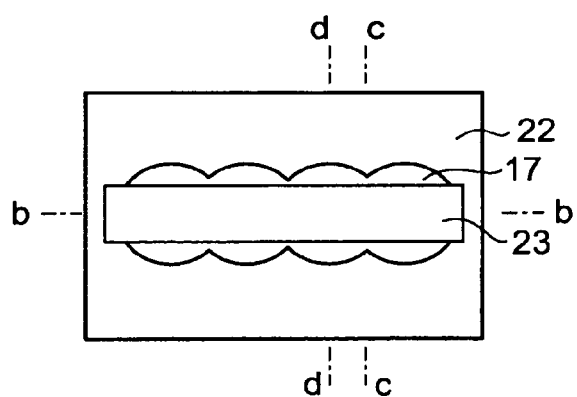
FIG. 27A is a plan view for explaining a tenth step ST10 in the manufacturing method according to the fourth embodiment.
Figure 27B:
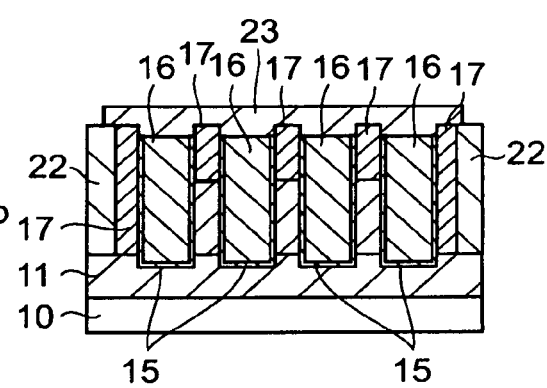
FIG. 27B is a sectional view along line b-b in FIG. 27A.
Figure 27C:
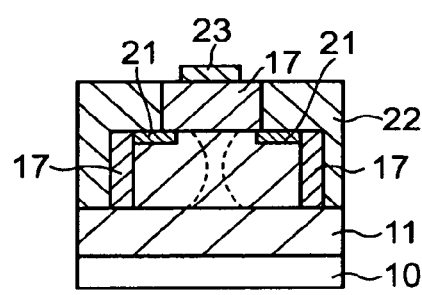
FIG. 27C is a sectional view along line c-c in FIG. 27A.
Figure 27D:
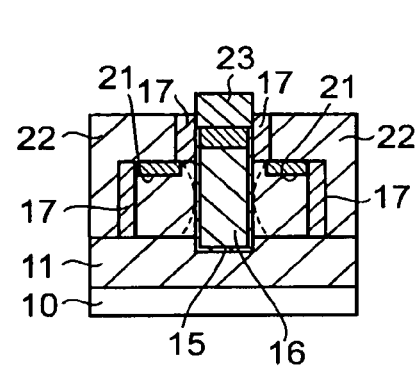
FIG. 27D is a sectional view along line d-d in FIG. 27A.

In a third step ST3, as shown in FIGS. 20E and 20F, in the same manner as the first embodiment, the SOI region 12 other than that on the device region is removed and etch-back of the SOI region 12 on the device region is performed to expose a part of the columnar dummy gate electrodes 41. As shown in FIG. 20F, an upper half of the columnar dummy gate electrodes 41 and about ¼ of the circumference of the dummy gate electrodes 41 at both ends are entirely exposed.

In a fourth step ST4, as shown in FIGS. 21A to 21D, as in the case of the first embodiment, the gate sidewall film 17 made of, for example, a silicon nitride film is formed and then, an impurity such as phosphorus, arsenic, or boron is implanted in the gate sidewall film 17 using the ion implantation technique to form the source and drain regions 18. Subsequently, oxidation is performed to form etching stop films 42 on the surface of the source and drain regions.

In a fifth step ST5, as shown in FIGS. 22A to 22D, a dummy interlayer film 43 made of polysilicon is formed and planarized to expose an upper surfaces of the dummy gate electrodes 41. In the first embodiment, the interlayer film 22 made of a laminated film of a silicon nitride film and a silicon oxide film is formed in the first embodiment. On the other hand, in the fourth embodiment, the dummy interlayer film 43 made of polysilicon is formed and planarized to expose the upper surfaces of the dummy gate electrodes 41.

In a sixth step ST6, as shown in FIGS. 23A to 23D, etching is selectively applied to the dummy gate electrodes 41 made of an oxide film, the dummy interlayer film 43 made of polysilicon, and the gate sidewall film 17 made of a silicon nitride film to open gate forming sections 44 equivalent to places where the dummy gate electrodes 41 are provided. In forming the gate forming sections 44, the BOX oxide film 11 below the dummy gate electrodes 41 is also slightly shaved and ground sections 45 are formed. When it is desired to prevent the ground sections 45 from being formed, in forming the holes 14 in the first step ST1, the SOI region 12 only has to be left about 5 nm in thickness at the bottoms of the holes 14 without drilling the holes 14 to pierce through the SOI region 12.

In a seventh step ST7, as shown in FIGS. 24A to 24D, for example, a hafnium oxide film is coated on sidewalls of the gate forming sections 44 and a titanium nitride film is filled in the gate forming sections 44 to form the gate insulating films 15 made of, for example, the hafnium oxide film and the metal gate electrodes 16 made of the titanium nitride are formed in the gate forming section 44. Subsequently, oxidation of the upper surfaces of the gate electrodes 16 is performed to form gate cap films 46 made of the titanium oxide film above the gate electrodes 16.

In an eighth step ST8, as shown in FIGS. 25A to 25D, the dummy interlayer film 43 made of polysilicon is removed. Subsequently, in a ninth step ST9, as shown in FIGS. 26A to 26D, after the etching stop films 42 are removed, the NiSi films 21 are formed on the source and drain regions using the salicide technique. In forming the NiSi films 21, since the metal gate electrodes 16 made of the titanium nitride film is protected by the gate cap films 46 made of the titanium oxide film, the metal gate electrodes 16 are not removed by selective etching in a salicide process.

In a tenth step ST10, as shown in FIGS. 27A to 27D, in the same manner as the first embodiment, the interlayer film 22 made of a laminated film of a silicon nitride film and a silicon oxide film is formed and planarized until the upper surfaces of the gate electrodes 16 are exposed. Thereafter, the second gate electrode 23 made of, for example, a laminated film of a titanium nitride film and aluminum is formed using the lithography technique.

According to the respective steps described above, it is also possible to form the pillared FET according to the embodiments of the invention even when the damascene gate technique is sued. It is possible to change the method to various other processes without departing from the scope of the embodiments of the invention.

Fifth Embodiment

Characteristics of the embodiments of the invention are that a sectional shape of the gate electrodes 16 in a plane is a columnar shape including a circle, an ellipse, or a square and that a channel region of the double gate structure is formed in the self-align manner by filling the space between the adjacent two columnar gate electrodes 16 with the gate sidewall film 17. In the explanations of the first to the fourth embodiments, a shape of the pillared gate electrodes is a cylindrical shape. However, the embodiments of the invention are not limited to this. A shape of the pillared gate electrodes may be any shape as long as the gate electrodes have pillar shape. Various modifications of the shape of the pillared gate electrodes are explained as a fifth embodiment. In the fifth embodiment, as shown in FIGS. 28A to 28F, plane shapes of the interlayer film 22 and the columnar gate electrodes 16 in a state in which the second gate electrode 23 is not shown are illustrated together with the gate sidewall film 17.

In examples shown in FIGS. 28A and 28B, a plane shape of columnar gate electrodes is an ellipse. In FIG. 28A, two elliptical centers are located in parallel in a direction in which the columnar gate electrodes 16 are arranged. In FIG. 28B, two elliptical centers are located in a direction orthogonal to a direction in which the columnar gate electrodes 16 are arranged.

In examples shown in FIGS. 28C and 28D, a plane shape of the columnar gate electrodes 16 is a rectangular. In FIG. 28C, long sides of respective rectangles are located in parallel to a direction in which the columnar gate electrodes 16 are arranged. In FIG. 28D, long sides of respective rectangles are located in a direction orthogonal to a direction in which the columnar gate electrodes 16 are arranged.

In examples shown in FIGS. 28E and 28F, a plane shape of the columnar gate electrodes 16 is a regular square. In FIG. 28E, respective sides of regular squares are located in directions parallel to and orthogonal to a direction in which the columnar gate electrodes 16 are arranged. In FIG. 28F, respective sides of regular squares are displaced at about 45 degrees in a direction in which the columnar gate electrodes 16 are arranged. As a further modification of the columnar gate electrodes 16 in FIG. 28F, it is also possible that the regular squares in FIG. 28F are changed to lozenges and positions where the lozenges are arranged are arranged long in a vertical direction in the figure or arranged long in a horizontal direction in FIG. 28F along a direction in which the columnar gate electrodes 16 are arranged.

In the embodiments of the invention, in a FINFET that is one of so-called double-gate structures in which two gate electrodes are formed across a channel in the MOSFET (the inventor calls this structure as a pillared gate), a problem of portions with high parasitic resistance formed in source and drain regions because of alignment margin of a gate pattern in the conventional FINFET is solved by forming a channel of a FIN shape in a self-align manner after forming a gate pattern and contriving a shape of the gate pattern. This makes it possible to form a FINFET without the problem of parasitic resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is clamed is:

1. A semiconductor device, comprising:
   plural columnar gate electrodes for plural MOSFETs formed in a row separately on a semiconductor substrate;
   a semiconductor region which is formed in a part between the neighboring two columnar gate electrodes of the plural columnar gate electrodes to form a channel of the MOSFETs;
   a source region disposed along one side of the row of the plural columnar gate electrodes; and
   a drain region disposed along another side of the row of the plural columnar gate electrodes.

2. The semiconductor device according to claim 1, further comprising:
   a gate sidewall film which is formed in a part between the neighboring two columnar gate electrodes and has a thickness larger than a half of width of an interval between the neighboring two columnar gate electrodes.

3. The semiconductor device according to claim 1, wherein the semiconductor substrate is an SOI substrate.

4. The semiconductor device according to claim 1, wherein the semiconductor substrate is a bulk substrate.

5. The semiconductor device according to claim 1, wherein each of the plural columnar gate electrodes is a round pillar.

6. The semiconductor device according to claim 1, wherein each of the plural columnar gate electrodes is an ellipse pillar.

7. The semiconductor device according to claim 1, wherein each of the plural columnar gate electrodes is a square pillar.

* * * * *